US012748905B2

(12) United States Patent
Kliuchnikov et al.

(10) Patent No.: US 12,748,905 B2
(45) Date of Patent: Sep. 29, 2026

(54) LAYOUTS FOR FAULT-TOLERANT QUANTUM COMPUTERS

(71) Applicant: Microsoft Technology Licensing, LLC, Redmond, WA (US)

(72) Inventors: Vadym Kliuchnikov, Redmond, WA (US); Nicolas Delfosse, Seattle, WA (US); Alexander Vaschillo, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 1091 days.

(21) Appl. No.: 16/428,913

(22) Filed: May 31, 2019

(65) Prior Publication Data

US 2019/0378032 A1 Dec. 12, 2019

Related U.S. Application Data

(60) Provisional application No. 62/681,540, filed on Jun. 6, 2018.

(51) Int. Cl.

| | |
|---|---|
| ***G06N 10/00*** | (2022.01) |
| ***G06F 30/392*** | (2020.01) |
| ***G06N 10/20*** | (2022.01) |
| ***G06N 10/40*** | (2022.01) |

(Continued)

(52) U.S. Cl.

CPC ........... *G06F 30/392* (2020.01); *G06N 10/20* (2022.01); *G06N 10/40* (2022.01); *G06N 10/70* (2022.01); *H03K 19/20* (2013.01)

(58) Field of Classification Search

CPC ............................... G06N 10/00; G06N 10/40

See application file for complete search history.

(56) References Cited

U.S. PATENT DOCUMENTS

| | | | |
|---|---|---|---|
| 2018/0053112 | A1 | 2/2018 | Bravyi |
| 2019/0044543 | A1 | 2/2019 | Chamberland et al. |
| 2019/0080254 | A1 | 3/2019 | Haah et al. |

FOREIGN PATENT DOCUMENTS

| | | | |
|---|---|---|---|
| CN | 101118608 | A | 7/2011 |
| CN | 106164942 | A | 7/2019 |
| CN | 107077641 | A | 3/2021 |

(Continued)

OTHER PUBLICATIONS

"Quantum Computing: Progress and Prospects (2019)" by the Nation Academies of Sciences, Engineering and Medicine. Chapter 7 p. 176 (Year: 2019).*

(Continued)

*Primary Examiner* — Bradley Smith

(74) *Attorney, Agent, or Firm* — Klarquist Sparkman, LLP

(57) ABSTRACT

Disclosed herein are example layouts and layout generation techniques for fault-tolerant quantum computers. Example embodiments comprise methods for performing a layout reduction technique for fault-tolerant quantum computing. In certain embodiments, a layout of an arbitrary quantum circuit is reduced to a layout of exponents of a multiple qubit Pauli matrix and measurements of a multiple qubit Pauli matrix. In certain embodiments, qubits are marked as one of a data, interface, or ancilla qubit for a 2D nearest neighbor graph of qubit connectivity, and an ancilla-path is provided from a respective data qubit to a respective interface qubit.

7 Claims, 14 Drawing Sheets

(51) Int. Cl.
*G06N 10/70* (2022.01)
*H03K 19/20* (2006.01)

(56) References Cited

FOREIGN PATENT DOCUMENTS

| | | |
|---|---|---|
| EP | 3300004 | 3/2018 |
| WO | WO 2016/081788 | 5/2016 |
| WO | WO 2017/053986 | 3/2017 |

OTHER PUBLICATIONS

"Quantum Computing in the NISQ era and beyond" by John Preskill Quantum Journal (Year: 2018).*
"Will Quantum Computing Ever Live up to Its Hype?" John Horgan Scientific American (Year: 2021).*
"Where Will Quantum Computers Create Value-and When?" Langione et al. Boston Consulting Group (Year: 2019).*
"Ground-State Preparation and Energy Estimation on Early Fault-Tolerant Quantum Computers via Quantum Eigenvalue Transformation of Unitary Matrices" by Dong et al., PRX Quantum 3, 040305 pp. 1-25 (Year: 2022).*
"Quantum Technology monitor" Mohr et al. McKinsey & Company pp. 1-52 (Year: 2022).*
"NISQ computing: where are we and where do we go?" Lau et al. AAPS Bulletin (Year: 2022) (Year: 2022).*
"Error mitigation extends the computational reach of a noisy quantum processor" Kandala et al. Nature vol. 567 (Year: 2019).*
Chamberland et al., "Fault-Tolerant Quantum Computing in the Pauli or Clifford Frame with Slow Error Diagnostics," arXiv:1704.06662v2, 11 pp. (Dec. 2017).
De Greve et al., "Ultrafast optical control of individual quantum dot spin qubits," *Institute of Physics, Reports on Progress in Physics*, vol. 76, No. 9, 18 pp. (Sep. 2013).
Fowler et al., "Surface codes: Towards practical large-scale quantum computation," *Physical Review A*, vol. 86, No. 3, 54 pp. (Oct. 2012).
International Search Report and Written Opinion dated Jan. 8, 2020, from International Patent Application No. PCT/US2019/035595, 25 pp.
Kliuchnikov et al., "Fast and efficient exact synthesis of single qubit unitaries generated by Clifford and T gates," arXiv:1206.5236v4, 23 pp. (Feb. 2013).
Oi et al., "Scalable Error Correction in Distributed Ion Trap Computers," arXiv:quant-ph/0606226v1, 8 pp. (Jun. 2006).
Paler et al., "Fault-tolerant high-level quantum circuits: form, compilation, and description," *Quantum Science and Technology*, vol. 2, No. 2, pp. 1-18 (Apr. 2017).
Van Meter et al., "Local and Distributed Quantum Computation," arXiv:1605.06951v1, 30 pp. (May 2016).
Office Action Received for European Application No. 19732200.1, mailed on Oct. 23, 2023, 9 pages.
Office Action Received for Chinese Application No. 201980037739.0, mailed on Apr. 10, 2024, 13 pages.
Communication pursuant to Article 71(3) EPC, Received for European Application No. 19732200.1, mailed on May 27, 2024, 7 pages.
Notice of Allowance Received for Chinese Application No. 201980037739.0, mailed on Apr. 28, 2025, 04 Pages (English Translation Provided).
Communication pursuant to Rules 70(2) and 70a(2) EPC and reference to Rule 39(1) Received for European Application No. 24201171.6, mailed on Mar. 3, 2025, 02 Pages.
Decision to grant a European patent pursuant to Article 97(1) received in European Application No. 19732200.1, mailed on Oct. 4, 2024, 2 pages.
Second Office Action Received for Chinese Application No. 201980037739.0, mailed on Aug. 20, 2024, 5 pages. (English translation Provided).
Extended European search report Received in European Patent Application No. 24201171.6, mailed on Jan. 28, 2025, 9 pages.
Third Office Action Received for Chinese Application No. 201980037739.0, mailed on Nov. 25, 2024, 6 Pages (English Translation Provided).
Chen, et al., "Nonlocal multi-target controlled-controlled gate using Greenberger-Horne-Zeilinger channel and qutrit catalysis", Chinese Physics B, vol. 24, Issue No. 07, May 29, 2015, 04 Pages.
Communication pursuant to Article 94(3) EPC Received for European Application No. 24201171.6, mailed on Mar. 3, 2026, 11 Pages.
Zhao, et al., "Combined local implementation of nonlocal operations using GHZ states", in repository of arXiv:0804.0714v1, Apr. 4, 2008, 05 Pages.
Communication under Rule 71(3) received for European Application No. 24201171.6, mailed on Jul. 14, 2026, 09 Pages.

* cited by examiner

INPUT QUANTUM COMPUTATION OF FORM $$C_2 M(a, Z_{i(2)}) C_1 \exp(i\phi Z_{i(1)}) C_0 |0\rangle^{\otimes n}$$

TO PRODUCE SEQUENCE OF EXPONENTIALS AND MEASUREMENTS OF THE FORM $$M(a, P_2) \exp(i\phi P_1) |0\rangle^{\otimes n}$$

↓

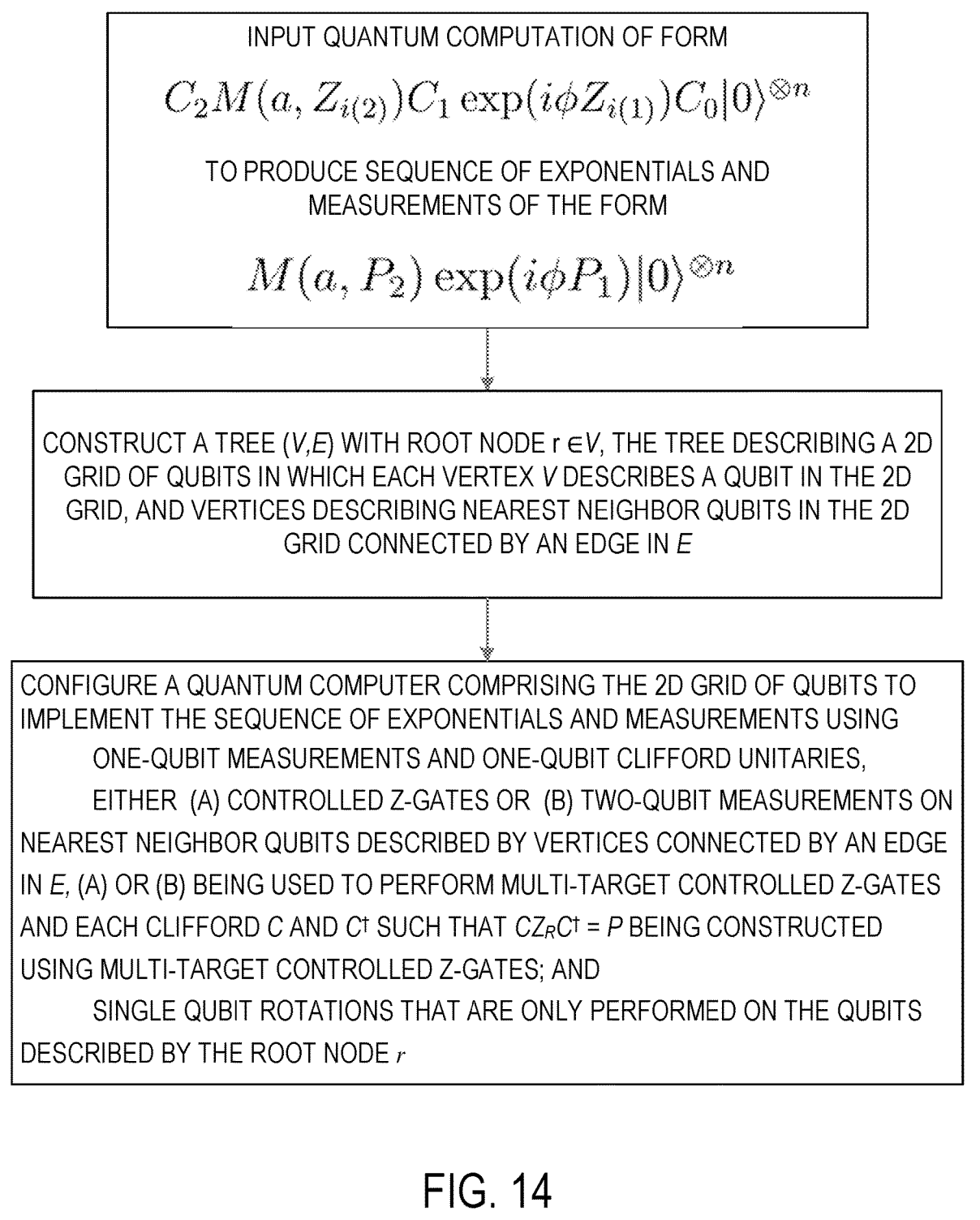

CONSTRUCT A TREE (*V*,*E*) WITH ROOT NODE r ∈*V*, THE TREE DESCRIBING A 2D GRID OF QUBITS IN WHICH EACH VERTEX *V* DESCRIBES A QUBIT IN THE 2D GRID, AND VERTICES DESCRIBING NEAREST NEIGHBOR QUBITS IN THE 2D GRID CONNECTED BY AN EDGE IN *E*

↓

CONFIGURE A QUANTUM COMPUTER COMPRISING THE 2D GRID OF QUBITS TO IMPLEMENT THE SEQUENCE OF EXPONENTIALS AND MEASUREMENTS USING

ONE-QUBIT MEASUREMENTS AND ONE-QUBIT CLIFFORD UNITARIES,

EITHER (A) CONTROLLED Z-GATES OR (B) TWO-QUBIT MEASUREMENTS ON NEAREST NEIGHBOR QUBITS DESCRIBED BY VERTICES CONNECTED BY AN EDGE IN *E*, (A) OR (B) BEING USED TO PERFORM MULTI-TARGET CONTROLLED Z-GATES AND EACH CLIFFORD *C* AND $C^\dagger$ SUCH THAT $CZ_RC^\dagger = P$ BEING CONSTRUCTED USING MULTI-TARGET CONTROLLED Z-GATES; AND SINGLE QUBIT ROTATIONS THAT ARE ONLY PERFORMED ON THE QUBITS DESCRIBED BY THE ROOT NODE *r*

FIG. 14

LAYOUTS FOR FAULT-TOLERANT QUANTUM COMPUTERS

CROSS-REFERENCE TO RELATED APPLICATIONS

This application claims the benefit of U.S. Provisional Application No. 62/681,540, entitled "LAYOUTS FOR FAULT-TOLERANT QUANTUM COMPUTERS" and filed on Jun. 6, 2018, which is hereby incorporated herein by reference in its entirety.

BACKGROUND OF THE INVENTION

Physical qubits have some probability of failure. Some of the qubits in a perfect rectangular grid may be dead, i.e., unsuitable for use. This not only decreases the number of available qubits, but also breaks connectivity between the remaining qubits. For example, a path of ancillas may have a dead qubit in it, severing part of the line and breaking connectivity of the corresponding data qubits to the interface qubit. An algorithm to create an optimal layout of qubits given an irregular qubit graph is desirable.

SUMMARY

Disclosed herein are example layouts and layout generation techniques for fault-tolerant quantum computers. The particular embodiments described should not be construed as limiting, as the disclosed method acts can be performed alone, in different orders, or at least partially simultaneously with one another. Further, any of the disclosed methods or method acts can be performed with any other methods or method acts disclosed herein. Likewise, the disclosed combinations of features can include rearrangements of any novel or nonobvious combination or subcombination of features.

One example embodiment comprises a method for performing a layout reduction technique for fault-tolerant quantum computing. In particular embodiments, the method is performed by one or more classical computing devices, at least some of which are in a configuration that can operate a quantum computer. In certain embodiments, a layout of an arbitrary quantum circuit is reduced to a layout of exponents of a multiple qubit Pauli matrix and measurements of a multiple qubit Pauli matrix; and a quantum computer is configured to implement the reduced layout. In particular implementations, qubits of the quantum computer comprise data qubits, interface qubits, and ancilla qubits. In further implementations, a graph of qubit connectivity satisfies a condition of providing an ancilla-path from one or more data qubits to the interface qubits.

Another example embodiment comprises another method for performing a layout technique for fault-tolerant quantum computing. In particular embodiments, the method is performed by one or more classical computing devices, at least some of which are in a configuration that can operate a quantum computer. In certain embodiments, qubits are marked as one of a data, interface, or ancilla qubit for a 2D nearest neighbor graph of qubit connectivity; an ancilla-path is provided from a respective data qubit to a respective interface qubit; and a quantum computer is configured to implement the ancilla-path from a respective data qubit to a respective interface qubit. In certain implementations, the method accounts for and avoids any broken qubits and satisfies a condition of providing an ancilla-path from a data qubit to the interface qubits.

Any of the methods described above can be performed in a system, comprising a quantum computing device; and one or more classical-computing devices, at least some of the one or more classical computing devices being programmed to perform any of the disclosed methods.

Additionally, any of the methods described above can be implemented as one or more classical-computer-readable-media storing classical-computer-executable instructions, which when executed by a classical computer cause the classical computer to perform any of the disclosed methods.

Further embodiments comprise, a quantum circuit configured to apply an exponent of a multiple qubit Pauli matrix and measure a multiple qubit Pauli matrix. In some implementations, an ancilla-path is provided from data qubits to the interface qubits. In further implementations, the quantum circuit has a depth not depending on the number of vertexes. In some implementations, the quantum circuit uses single or low-depth multiple-target CNOT gates as a sub-circuits.

Some embodiments, comprise a quantum circuit configured to (a) provide a multi-target CNOT gate using a single-qubit and two-qubit Pauli measurements and single qubit Clifford gates; or (b) provide a multi-target CNOT gate using a single-qubit, Pauli measurements, single qubit Clifford gates and Controlled-Z gates. In some implementations, the quantum circuit provides a multi-target CNOT gate using a single-qubit and two-qubit Pauli measurements and single qubit Clifford gates, wherein the quantum circuit works with qubits for which a graph of qubit connectivity satisfies a condition of providing an ancilla-path from a target qubit to the control qubit. In further implementations, the quantum circuit provides a multi-target CNOT gate using a single-qubit and two-qubit Pauli measurements and single qubit Clifford gates, wherein the quantum circuit has a depth not depending on the number of vertexes. In some implementations, the quantum circuit is configured to provide a multi-target CNOT gate using a single-qubit, Pauli measurements, single qubit Clifford gates and Controlled-Z gates, and wherein the quantum circuit works with qubits for which graph of qubit connectivity satisfies a condition of providing an ancilla-path from a target qubit to the control qubit. In further implementations, the quantum circuit, is configured to provide a multi-target CNOT gate using a single-qubit, Pauli measurements, single qubit Clifford gates and Controlled-Z gates, wherein the quantum circuit has a depth not depending on the number of vertexes.

The foregoing and other objects, features, and advantages of the disclosed technology will become more apparent from the following detailed description, which proceeds with reference to the accompanying figures.

BRIEF DESCRIPTION OF THE DRAWINGS

FIG. 14 illustrates a quantum computation method.

DETAILED DESCRIPTION

1. General Consideration

Figure 1:
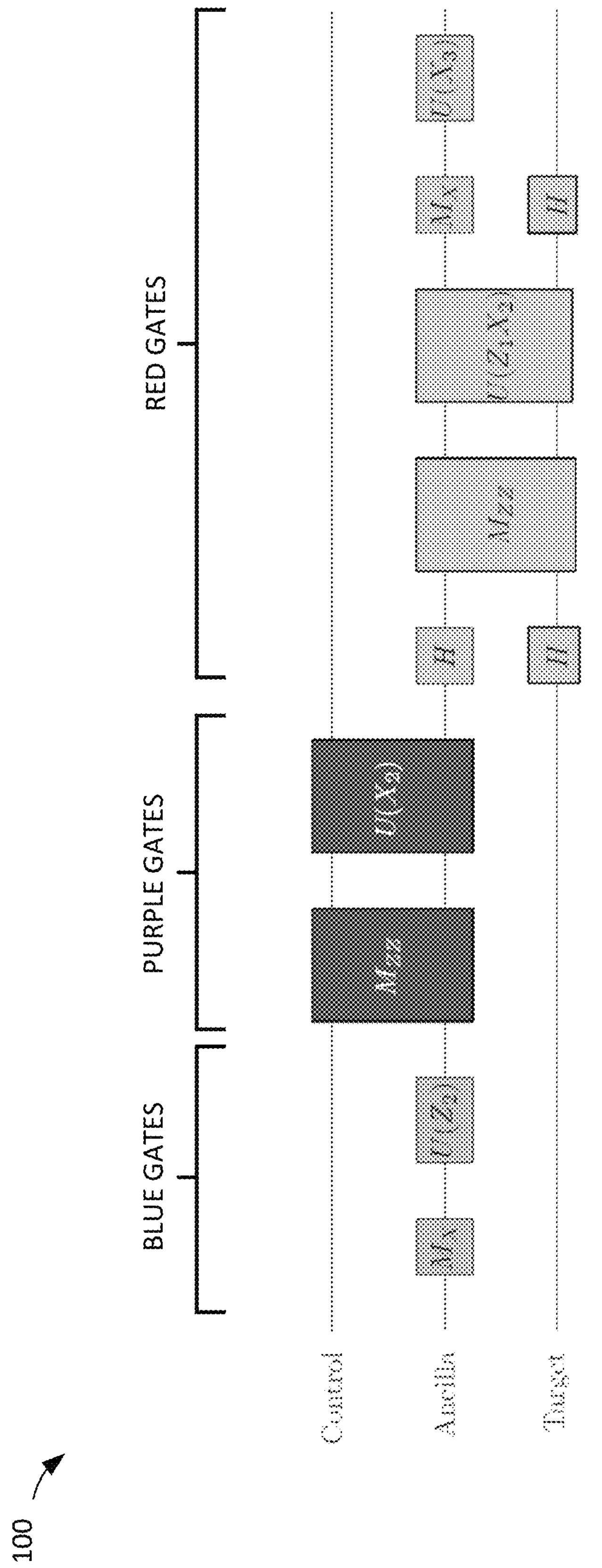
FIG. 1 is a schematic block diagram that represents the circuit realizing a CNOT gate between the top qubit and the bottom qubit.

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

2. Quantum Computing Preliminaries and Notation

Let I, X, Y and Z denote single qubit Pauli matrices. All single qubit Pauli matrices are Hermitian matrices. Square of every Pauli matrix is equal to I. A multiple qubit Pauli matrix is a tensor product (denoted as ⊗) of single qubit Pauli matrices. Notation $X_k$, $Y_k$, $Z_k$ refers to a multiple qubit Pauli matrix with X, Y and Z on qubit k and I on all other qubits. For example $X_2$ as 3 qubit Pauli matrix refers to the matrix:

$$I \otimes X \otimes I.$$

Multiple qubit Pauli matrices are also Hermitian and their square is the identity matrix. Below, the multiple qubit Pauli matrix will simply be called a Pauli matrix. I is used for the identity matrix on any number of qubits. The dimension of I will be clear from the context.

The notation $P|_k$ is used for the k-th component of the multi-qubit Pauli matrix. For example, for $P=X_aY_bZ_c$, $P|_a-X$, $P|_b-Y$ and $P|_c-Z$.

For any square matrix A, Tr(A) is the sum of the diagonal elements of A. For arbitrary square matrices A, B it is the case that Tr(AB)=Tr(BA). In addition, $\mathrm{Tr}(A \otimes B)=\mathrm{Tr}(A)\cdot\mathrm{Tr}(B)$.

Orthogonal projector is a Hermitian matrix C with property $C^2=C$. Tr(C) is equal to the dimension of the subspace that C projects onto.

Matrices A and B commute if AB=BA. Matrices A and B anti-commute if AB=−BA. Any two Pauli matrices either commute or anti-commute.

Plus state $|+\rangle$ is $(|0\rangle+|1\rangle)/\sqrt{2}$.

$H_k$ is the Hadamard gate on qubit k. It is equal to $(X_k-Z_k)/\sqrt{2}$.

One-qubit Clifford gates are $H=(X+Z)/\sqrt{2}$, $S=(I-Z)/\sqrt{2}$, products HP, SP, HSP, SHP, HSHP where P is I, X, Y, Z. One-qubit Clifford gates also include Pauli matrix X, Y, Z.

$CZ_{ij}$ is Controlled-Z gate on qubits i and j. It is equal to $(I+Z_i+Z_j-Z_iZ_j)$.

Hermitian matrix M stabilizes state $|\psi\rangle$ if the state $|\psi\rangle$ is +1 eigenvector of M. In other words, $M|\psi\rangle=|\psi\rangle$.

n-qubit cat state is the state $(|0\rangle^{\otimes n}+|1\rangle^{\otimes n})/\sqrt{2}$ also known as GHZ state.

Let U be some unitary and let $Q=UPU^\dagger$, it will be said that U maps P to Q.

3. Quantum Circuit Layout Problem

In this section, example embodiments of algorithms that solve special cases of the following problem are disclosed:

Problem 3.1 (Layout problem for a graph). Let (V,E) be a graph and $V_{rot}$ be a subset of V. Vertexes are qubits. Consider quantum computation that uses one and two qubits Clifford operations, single qubit rotations $\exp(i\varphi Z)$ and single qubit measurements. Perform a quantum computation that produces the same measurement outcomes using:

- one qubits measurements and one qubit Clifford unitaries,
- either (A) controlled-Z gates or (B) two qubit measurements on qubits connected by an edge
- single qubit rotations $\exp(i\varphi Z)$ can only be performed on subset $V_{rot}$ Using two (e.g., only two) qubit measurements on every edge is more restrictive. Any two qubit measurement can always be performed using two Controlled-Z gates, one measurement, and a single qubit Clifford gate. However, it is not possible to perform a Controlled-Z gate on two qubits by only measuring these two qubits. Restricting the qubits on which single qubit rotations can be performed reflects the fact that performing these rotations on a fault-tolerant quantum computer typically uses resource states that are usually produced in a dedicated part of the computer. Subset $V_{rot}$ represents qubits to which it is easy to deliver resource states needed to implement the rotations.

The above problem can also be reduced to the case where $V_{rot}$ comprises one element r and (V,E) is a tree with the root r. Indeed, for any graph (V,E) one can compute a spanning tree with root r. First, the solution for this case is described.

The first part of an example solution is to transform quantum computation to a canonical from. Here, the notation M(a, P)=(I+aP)/2 is used for the measurement of any multiple qubit Pauli operator P with outcome a=±1. Suppose one has n qubit quantum computation described as:

$$C_2 M(a, Z_{i(2)}) C_1 \exp(i\phi Z_{i(1)}) C_0 |0\rangle^{\otimes n} \tag{1}$$

where $C_k$ are some Clifford operators. Recall that for any Clifford operator C and Pauli matrix P, product $CPC^\dagger$ is a Pauli matrix. Recall also that exponents and measurement have the following property:

$$UM(a, P)U^\dagger = M(a, UPU^\dagger),\ U\exp(i\phi P)U^\dagger = \exp(i\phi UPU^\dagger) \tag{2}$$

One can rewrite quantum computation (1) as:

$$C_2 C_1 C_0 \big((C_1 C_0)^\dagger M(a, Z_{i(2)}) C_1 C_0 \big(C_0^\dagger \exp(i\phi Z_{i(1)}) C_0\big)|0\rangle^{\otimes n}$$

Using properties of measurement and exponential (2) one can further rewrite computation as:

$$C' M(a, P_2)\exp(i\phi P_1)|0\rangle^{\otimes n}, \text{ where } C' = C_2 C_1 C_0$$

One can transform any quantum computation to a sequence of exponentials and measurements of multiple-qubit Clifford operation and the Clifford gate in the end. The Clifford gate in the end does not need to be executed because information is not extracted from the quantum computer after executing it.

To perform an arbitrary computation under constraints described in Problem 3.1, it is sufficient to be able to perform measurements M(a, P) and exp(iφP) for arbitrary Pauli matrices supported on certain qubits $V_{data} \subset V$. The size of subset $V_{data}$ determines a maximal number of qubits one can use for computation. It is sufficient to be able to perform a Clifford C and $C^\dagger$ such that $CZ_rC^\dagger=P$ under constraints on two qubit operations described in Problem 3.1. Such Clifford operations can be constructed using multi-target Controlled-Z gates as described in Section 4. Table 1 and Table 2 show the programs for such a Clifford C operation that uses multiple-target Controlled-Z gates. The program of Table 1 applies Controlled-Z gates on edges of the tree, and the program of Table 2 applies two qubit measurements. When using this construction for Clifford C, set $V_{data}$ corresponds to all leaves of the tree except the root.

In Section 5, a description is provided as to how to construct a tree with a high ratio of the number of leaves to the number of vertexes in 2D nearest neighbor architecture. Also considered is the case when fraction of the qubits in 2D nearest neighbor architecture is broken. It was found that when the fraction of broken is above 90%, one can still utilize good amount of qubits for computation.

TABLE 1

| Program for Pauli Mapper Using Controlled-Z Gates |
|---|
| # Input: V is the set of qubits, vertexes of a tree, E is the set of tree edges. |
| #\| \| \| \| Qubits with corresponding vertex degree > 1 are all in the plus state. |
| #\| \| \| \| P is a Pauli operator supported on tree leaves excluding the root. |
| # Effect: Clifford that maps Z on the root vertex to P is performed on tree leaves. |
| #\| \| \| \| \| The rest of the vertexes (the ones with |
| #\| \| \| \| \| degree >1) are return back to a plus state. |
| operation PauliMapper((V,E),P) |
| \| Let r be a root of (V,E) |
| \| Let $V_{targets}$ be subset of leaves v such that $P\|_v \neq I$ |
| \| Let $V_{excluded}$ be leaves not in $V_{targets} \cup \{r\}$ |
| \| Let $(V_1,E_1)$ be a sub-tree of (V,R) such that $V_1 \cap V_{excluded} = \emptyset$ |
| \| $H_r$ |
| \| MultipleTargetControlledZ$(V_1,E_1)$; see Table 6 |
| \| $H_r$ |
| \| Let v' be a vertex from $V_{targets}$ |
| \| Let $(V_{path},E_{path})$ be a sub-tree of (V,R) that only contains path from r to v' |
| \| $H_{v'}$ |
| \| MultipleTargetControlledZ$(V_{path},E_{path})$; see Table 6 |
| \|$H_{v'}$ |
| \| foreach v in $V_{targets}$ |
| \| \| Apply single qubit Clifford that maps Pauli Z to $P\|_v$ |

4. Low Depth Multi-Target Controlled-Z Gates

This section describes two ways of performing low-depth multi-target Controlled-Z gates. One is suitable for an architecture that has native Controlled-Z gates. Another one is for the architecture with two qubit operations restricted to only measurements of two qubit Pauli matrices. Notable for both is low depth circuit for cat state preparation and low depth circuit for fanout gate. In the following, qubits are considered to be vertexes of a tree and two qubit operations are allowed only

TABLE 2

| Example Program for Pauli Mapper Using Two Qubit Pauli Measurements |
|---|
| # Input: V is the set of qubits, vertexes of a tree, E is the set of tree edges. |
| #\| \| \| \| Qubits with corresponding vertex degree > 1 are all in the plus state. |
| #\| \| \| \| P is a Pauli operator supported on tree leaves excluding the root. |
| # Effect: Clifford that maps Z on the root vertex to P is performed on tree leaves. |
| #\| \| \| \| \| The rest of the vertexes (the ones with |
| #\| \| \| \| \| degree > 1) are returned back to a plus state. |
| operation PauliMapperMeasure((V,E) ,P) |
| \| Let r be a root of (V,E) |
| \| Let $V_{targets}$ be subset of leaves v such that $P\|_v \neq I$ |
| \| Let $V_{excluded}$ be leaves not in $V_{targets} \cup \{r\}$ |
| \| Let $(V_1,E_1)$ be a sub-tree of (V,R) such that $V_1 \cap V_{excluded} = \emptyset$ |
| \| Let $(V_2,E_2)$ be the result of removing all leaves except the root from $(V_1,E_1)$ |
| \| Let L be a set of leaves of $V_2$ |
| \| foreach v in L |
| \| \| Let (v,v') be an edge in $V_1$. |
| \| \| Add (v,v') to $(V_2,E_2)$ |
| \| $H_r$ |
| \| MultipleTargetControlledZMeasure$(V_2,E_2)$ ; see Table 7 |
| \| $H_r$ |
| \| foreach a in L |
| \| \| Let (t,a) be an edge in $V_2$ |
| \| \| $H_t$ |
| \| \| foreach c in V such that (c,a) is an edge in $V_1$ but not in $V_2$ |
| \| \| \| ControlledZbyMeasurement(c,t,a) # See Proposition 4.5 |
| \| \| $H_t$ |

TABLE 2-continued

Example Program for Pauli Mapper Using Two Qubit Pauli Measurements

```
26 | Let v' be a vertex from V_targets
27 | Let (V_path,E_path) be a sub-tree of (V,R) that only contains path
     from r to v'
28 | H_v'
29 | MultipleTargetControlledZMeasure(V_path,E_path) ; see Table 7
30 | H_v'
31 | foreach v in V_targets
32 | | Apply single qubit Clifford that maps Pauli Z to Pl_v
```

TABLE 3

Program for cat state $(|0\rangle^{\otimes n}+|1\rangle^{\otimes n})/\sqrt{2}$ preparation in low depth

```
1  # Input: V is the set of qubits, vertexes of a tree, E is the set of
   tree edges
2  #| | | | All qubits are is the plus state.
3  #| | | | Tree (V,E) is edge colored, w is a qubit in V
4  # Effect; All qubits are in cat state
5  operation CatStatePrep(V,E,w)
6  | foreach color c of the tree # number of colors is the largest vertex
   degree
7  | | foreach edge e = (u,v) of color c # body of this loop can be
   done in depth 1
8  | | | Measure observable Z ⊗ Z on qubits u and v
9  | | | Label edge e by the measurement outcome
10 | | | Use label 0, when the outcome is +1 and label 1 otherwise
11 | Assign vertex w label 0, assign other vertexes label 0 or 1
12 | | such that for every edge e=(u,v)
13 | | label(e) = label(u) ⊕ label(v). # this can be done using tree
   traversal
14 | foreach vertex v # body of this loop can be done in depth 1
15 | | if label(v) = 1 then apply X to qubit v
```

between qubits connected by an edge. Recall that when one needs to perform Z⊗Z measurements of qubits a and b, it is equivalent to the following:

```
1 CNOT_a,b # a is the control, b is the target
2 Measure Z_b
3 CNOT_a,b
```

The next proposition shows that the circuit depth required to prepare cat state on a tree does not depend on the number of tree vertexes.

Proposition 4.1 (Low depth cat state preparation). Let (V,E) be a tree. Vertexes of the tree correspond to qubits. All the qubits are in plus state. One can only apply the following operations:

measure observable Z⊗Z on qubits connected by an edge, apply Pauli X to any of the qubits except chosen in advance qubit w Then the cat state on qubits corresponding to vertexes can be prepared using |E|=|V|−1 of Z⊗Z measurements, in depth equal to the largest vertex degree. In addition, one requires at most |V|=1 Pauli X operations performed all in parallel. The pseudo-code for cat state preparation is given in Table 3.

Proof. First, it will be shown that the procedure on Table 3 indeed prepares the cat state. Recall that cat state $|\psi\rangle=(|0\rangle^{\otimes n}+1\rangle^{\otimes n})/\sqrt{2}$ on n=|V| can be uniquely described by the following constraints (up to the global phase):

$$\prod_{v\in V} X_v\,|\psi\rangle = |\psi\rangle,\ Z_u Z_v\,|\psi\rangle = |\psi\rangle,\ (u, v)\in E$$

Indeed, the above implies that $|\psi\rangle$ is stabilized by the following projector:

$$P=\frac{1}{2}\left(I+\prod_{v\in V}X_v\right)\prod_{(u,v)\in E}\frac{I+Z_uZ_v}{2}$$

Next, expand the above product into sum of Pauli matrices. Use |E|=|V|−1 and that all non-identity Pauli matrices have trace zero to check that, Tr(P)−1. Conclude that P fixes one dimensional sub-space.

Initializing all qubits to $|+\rangle$ state ensures that their joint state is stabilized by $\Pi_{v\in V}X_v$. Measuring $Z_uZ_v$ for (u,v) ∈ E ensures that the state is +1 or −1 eigenstate of $Z_uZ_v$. Note that because all constraints commute, adding a new one via measurement preserves all previous constraints. By the time all measurements were performed and the edges labeled, the state of the qubits $|\varphi\rangle$ satisfies the following constraints:

$$\prod_{v\in V} X_v\,|\phi\rangle = |\phi\rangle,\ Z_u Z_v\,|\phi\rangle = (-1)^{label(u,v)}\,|\phi\rangle,\ (u, v)\in E$$

It remains to fix the −1 signs. This can be done by applying single qubit Pauli X operators to vertexes. One can label vertex with 0 if one does not apply X to it, and with 1 if one does. This changes the signs in the following way:

$$Z_uZ_v(X_u^aX_v^b|\phi\rangle)=(-1)^{label(u,v)\oplus a\oplus b}(X_u^aX_v^b|\phi\rangle),$$

$$a=\text{label}(u),\ b=\text{label}(v),\ (u,v)\in E$$

The label assignment can be found by one tree traversal, for example, using a depth first search. The label of the tree root can be chosen to be zero. The label of each vertex is computed based on the label of the parent and the label of the edge connecting the vertex and its parent.

Finally note that edges of each color do not share vertexes. For this reason, measurements on corresponding qubits can all be performed in parallel. This implies that the depth of the measurement part of the cat state preparation is equal to the chromatic number of the tree which is the largest vertex degree plus one.

Given an n-qubit cat state it is sufficient to perform one two-qubit measurement to get a fanout gate $$(\alpha|0\rangle+\beta|1\rangle(\bigotimes|+\rangle^{\otimes n-1}\mapsto\alpha|0\rangle^{\otimes n}+\beta|1\rangle^{\otimes n}$$

from one to n+1 qubits. The next proposition gives some intuition how one two qubit measurement can help perform a partially specified unitary acting on n+1 qubits.

Proposition 4.2 (Unitary operations via measurement). Let $|\psi\rangle$ be a multiple qubit state and P be a multiple qubit Pauli matrix that stabilizes $|\psi\rangle$ (e.g., $P|\psi\rangle=|\psi\rangle$). Let Q be another multiple qubit Pauli matrix that anti-commutes with P. Then the probability of measuring ±1 for observable Q of $|\psi\rangle$ is ½. Moreover, if the measurement outcome is −1, then applying P conditioned on the outcome −1 is equivalent to measuring −1. Under above conditions, one can always deterministically apply the following transformations to $|\psi\rangle$ via measurement:

$$|\psi\rangle \mapsto \frac{I+Q}{\sqrt{2}}\left|\psi\right\rangle = \exp\left(\frac{\pi}{4}QP\right)\left|\psi\right\rangle \tag{3}$$

Proof. First, the probability of measuring +1 is ½ is shown. One can show this by showing the probabilities of measuring +1 and −1 are equal. Recall that the probability of measuring ±1 is $$Tr\left(\frac{I \pm Q}{2}\left|\psi\right\rangle\langle\psi|\right).$$

Next stabilizes $|\psi>$ and anti-commutativity or P,Q to check the following equalities:

$$\left\langle\psi\left|\frac{I+Q}{2}\right|\psi\right\rangle = \left\langle\psi\left|P\frac{I+Q}{2}P\right|\psi\right\rangle = \left\langle\psi\left|\frac{I+PQP}{2}\right|\psi\right\rangle = \left\langle\psi\left|\frac{I-Q}{2}\right|\psi\right\rangle$$

One can see that when the measurement outcome is +1, the state is transformed according to (3). Next check that this is again the case when the measurement outcome is −1 and apply correction P.

TABLE 4

| Program for MeasurePlusOne |
|---|
| operation MeasurePlusOne(Q/P) |
| \| ~ Assert: measuring P must always result in +1 ~ |
| \| r ← MeasureObservable(Q) # a is 0 if measured +1, and a is 1 if measured −1 |
| \| $P^r$ # Applies P if measurement result is 1 and does nothing otherwise |

If the measurement outcome was −1, one can apply correction P and the state becomes:

$$P\frac{I-Q}{\sqrt{2}}\left|\psi\right\rangle = \frac{I+Q}{\sqrt{2}}P\left|\psi\right\rangle = \frac{I+Q}{\sqrt{2}}\left|\psi\right\rangle$$

In the above, the anti-commutativity of P, Q was used and the fact that P stabilizes $|\psi\rangle$. Finally, one can note that $(I+Q)|\psi\rangle - (I+QP)|\psi\rangle$ and use the fact that for any matrix A that squares to minus identity $\exp(\varphi A)=I\cos(\varphi)+A\sin(\varphi)$.

It has been shown that under the conditions of Proposition 4.2 a measurement with classical feedback is equivalent to a unitary transformation. This is because QP is anti-hermitian matrix and exp $$\left(\frac{\pi}{4}QP\right)$$

is a unitary. Note that unitary operation performed includes pauli P. Even if Q acts only on a couple qubits, the result of operation can be equivalent to a unitary on big number of qubits. This happens when constraint P involves large number of qubits.

The above discussion motivates the introduction of operation MeasurePlusOne(Q/P) (see Table 4). It performs operation given by Equation (3), given the state to which it is applied stabilized by P. In other words, operation MeasurePlusOne always projects the state onto +1 eigensubspace of Q. One can call P a constraint on the state.

Now it is shown how MeasurePlusOne can be used to perform fanout gate.

Proposition 4.3 (Low depth fanout). Let (V,E) be a tree. Vertexes of the tree correspond to qubits. All qubits except the root of the tree are in $|+\rangle$ state. One can only apply the following operations:

measure observable Z⊗Z on qubits connected by an edge, apply Pauli X to any of the qubits.

TABLE 5

| Program for fanout gate $(\alpha|0\rangle + \beta|1\rangle) \otimes |+\rangle^{\otimes n-1} \longmapsto \alpha|0\rangle^{\otimes n} + \beta|1\rangle^{\otimes n}$ |
|---|
| # Input: V is the set of qubits, vertexes of a tree, E is the set of tree edges. |
| #\| \| \| \| All qubits except the root of the tree are in a plus state |
| # Effect: Fanout gate is performed from the root to all qubits |
| operation Fanout1(V,E) # Concise version of the fanout operation used in the proof |
| \| Let (V',E') be a tree that is the result of removing the root from (V,E) |
| \| Let r be a root of (V,E) and (r,r') be an edge |
| \| CatStatePrep(V',E',r') # Prepare the cat stats on the vertexes V', see Table 3 |
| \| \| Let m be the result of measuring observable Z ⊗ Z between qubits r and r' |
| \| if m = −1 then |
| \| \| Apply Pauli X gates to all the qubits except the root of the tree |
| operation Fanout(V,E) # Depth optimized version of Fanout operation |
| \| foreach color c of the tree # number of colors is the largest vertex degree + 1 |
| \| \| foreach edge e = (u,v) of color c # body of this loop can be done in depth 1 |
| \| \| \| Measure observable Z ⊗ Z on qubits u and v |
| \| \| \| Label edge e by the measurement outcome |
| \| \| \| Use label 0, when the outcome is +1 and label 1 otherwise |
| \| Let r be a root of (V,E) and (r,r') be an edge |
| \| Assign vertex r' label 0, assign other vertexes label 0 or 1 |
| \| \| such that for every edge e=(u,v) |
| \| \| label(e) = label(u) ⊕ label(v). # this can be done using tree traversal |
| \| if label(r,r') = 1, then |
| \| \| apply x ⟼ x ⊕ 1 to labels of all vertexes |
| \| foreach vertex v except r # body of this loop can be done in depth 1 |
| \| \| if label (v) = 1 then apply X to qubit v |

The fanout gate from the root to all the qubits can be performed using |E|=|V|−1 of Z⊗Z measurements, in depth equal to the largest vertex degree. In addition, one requires at most |V|−1 Pauli X operations performed all in parallel. The pseudo-code for fanout gate is given in Table 5.

Proof. The correctness of operation Fanout 1 in Table 5 is first shown. Next, it is shown that it is equivalent to operation Fanout described on the same table. The claim of the proposition regarding depth of Z⊗Z measurements follows from the fact that the number of colors in the edge coloring of the tree is equal to the maximal vertex degree plus one.

Let state of the root vertex be $\alpha|0\rangle+\beta|1\rangle$. According to Proposition 4.2, the last three lines of operation Fanout 1 on Table 4 deterministically project on +1 eigenspace of $Z_rZ_{r'}$. This is because cat state is stabilized by the product of X over all non-root vertexes of the tree and this product anti-commutes with $Z_r Z_{r'}$. Therefore after last three lines of Fanout 1 the state of all qubits becomes:

$$\frac{I + Z_1 Z_2}{\sqrt{2}}(\alpha|0\rangle + \beta|1\rangle) \otimes (|0\rangle^{\otimes n} + |1\rangle^{\otimes n}) \Big/ \sqrt{2} = \alpha|0\rangle^{\otimes n} + \beta|1\rangle^{\otimes n}$$

This is because projector $(I+Z_1Z_2)/2$ selects computational basis states with first two bits equal:

$$(I + Z_1 Z_2)|0\rangle|0\rangle^{\otimes n} = 2|0\rangle|0\rangle^{\otimes n},\ (I + Z_1 Z_2)|0\rangle|1\rangle^{\otimes n} = 0.$$

Next, a check is made that the operations Fanout and Fanout 1 on Table 5 are equivalent. First, one can inline CatStatePrep. Next, one can observe that there is no X correction performed on vertex r' before measuring $Z_r Z_{r'}$. Therefore measurement $Z_r Z_{r'}$ can be performed together with all other measurements. Finally, X corrections applied in the end of CatStatePrep are combined with application of the X corrections in the end of Fanout 1 operation.

Next, a description is provided as to how to use the fanout gate to perform multiple target Controlled-Z. One can start with the case that is more suitable for the architecture with native Controlled-Z gates.

Proposition 4.4 (Low depth multiple target Controlled-Z). Let (V,E) be a tree. Vertexes of the tree correspond to qubits. Qubits that are not tree leaves are in a plus state. Measurements of observable Z⊗Z and Controlled-Z gates can only be applied to qubits connected by an edge. Programs given on Table 6 perform multiple target Controlled-Z gate with tree root being control and the rest of the leaves being targets. The rest of the tree vertices are returned back to plus state.

The depth of joint measurements is at most the largest vertex degree. The depth of Controlled-Z gates is at most the largest vertex degree. The total number of joint measurements and Controlled-Z operations applied equals to the total number of edges. The depth of X measurements is one.

TABLE 5

Program for multi-target Controlled Z gate

```
# Input: V is the set of qubits, vertexes of a tree, E is the set of tree edges.
#| | | | Qubits with corresponding vertex degree >1 are all is the plus state.
# Effect: Multi-target controlled Z gate is performed with root of the tree
#being a control and the rest of the leaves being targets.
#The rest of the vertexes (the ones with degree > 1) are returned
#back to a plus state.
operation MultipleTargetControlledZ1(V,E) # Concise version used in a proof
| Let (V',E') be a tree that is the result of removing all leaves except the root
# from (V,E)
| Fanout (V',E') # Fanout gate from the root to the rest of the tree,
see Table 4
| foreach leave v of (V,E) except the root
| | Let (v,v') be an edge in E
| | ControlledZ(v,v')
| Let r be the root of V and V'
| foreach vertex v of (V',E') except the root
| | MeasurePlusOne(X_v/Z_vZ_r)
```

TABLE 5-continued

Program for multi-target Controlled Z gate

```
operation MultipleTargetControlledZ(V,E) # Depth optimized version
| Let (V',E') be a tree that is the result of removing all leaves except the root
| from (V,E)
| Fanout(V',E') # Fanout gate from the root to the rest of the tree, see Table 5
| | foreach leave v of (V,E) except the root
| | Let (v,v') be an edge in E
| | ControlledZ(v,v')
| Let r be the root of V and V'
| foreach vertex v of (V',E') except the root # can be done in depth 1
| | Measure X on qubit v, label v with zero if measured +1 and with 1 otherwise
| Label root with the parity of all leaves except the root
| foreach vertex v of (V',E')
| | if label(v) is 1 then Apply Z to v
```

Proof. It is first shown that program MultipleTargetControlledZ1 on Table 6 performs multiple target, Controlled-Z gate and satisfies required postcondition. Next, it, is shown that, the program is equivalent to MultipleTargetControlledZ. Finally, the depth of the operations performed in MultipleTargetControlledZ are counted.

Recall that on computational basis states multiple-target Controlled-Z gate acts as following:

$$|c, t_1, \ldots, t_n\rangle = \prod_{k=1}^{n} \text{Controlled}-Z_{c,t_k} \left| c, t_1, \ldots, t_n \right\rangle = (-1)^{c(t_1 \oplus \ldots \oplus t_n)} \left| c, t_1, \ldots, t_n \right\rangle$$

Above the first qubit is control and the rest are targets. In this case, control and targets are leaves of the tree. One also has, say m, other qubits that are not leaves of the tree. Using fanout operation, the state transforms as:

$$|c, t_1, \ldots, t_n\rangle \otimes |+\rangle^{\otimes m} \mapsto_{Fanout} |c, t_1, \ldots, t_n\rangle \otimes |c\rangle^{\otimes m}$$

After the first foreach loop the state becomes:

$$(-1)^{c(t_1 + \ldots + t_m)}|c, t_1, \ldots, t_n\rangle \otimes |c\rangle^{\otimes m}$$

This is because Controlled-Z gates are performed between each of the target qubits and some qubit that is not a leaf of the tree and is in state $|c\rangle$. Note that the above state (4) is −1 eigenstate of all $Z_r Z_v$ operators, where r is a tree root and control qubit and v are non-leaf qubits. For this reason, one can use MeasurePlusOne operations to set all non-leaf qubits back to plus state. It is important to note that setting one of the non-leaf qubits to plus state does not violate $Z_r Z_v$ constraints on other qubits and therefore this can be done in parallel.

To obtain MultipleTargetControlledZ program, one can inline all calls to MeasurePlusOne. Next one can observe that all measurements can be performed first and the correction can be performed afterwards. As shown below, one can also collect together all the corrections applied to the root vertex so the correction can be applied once.

To count, the depth of Z⊗Z measurements, one can observe that, they are all performed within Fanout operation and the larges vertex degree of (V', E') is at most largest vertex degree of (V,E). The depth of Controlled-Z operations performed is at most number of edges that share a vertex that is the largest degree of a vertex.

The rest of this section is devoted to the architectures with two qubit measurements only. First recall how to perform Controlled-Z gate in this architectures using one extra qubit. It is convenient to use MeasurePlusOne(Q/P) to concisely express this result. This result will also help one to get the insight needed for multiple target Controlled-Z.

Proposition 4.5. Consider three qubits a, b, c, with qubit a in |+⟩ state, then the operation:

| | |
|---|---|
| 1 | operation ControlledZbyMeasurement(c,t,a) |
| 2 | \| MeasurePlusOne ($Z_aZ_t/X_a$) |
| 3 | \| $H_a$ |
| 4 | \| MeasurePlusOne($Z_aZ_c/Z_tX_a$) |
| 5 | \| MeasurePlusOne($X_a/Z_aZ_c$) |

performs Controlled-Z gates between qubits t, c and returns qubit a to |+⟩ state.

Proof. Let one first check that ail the MeasurePlusOne can be applied. The qubit a is in |+⟩, therefore the input state is stabilized by $X_a$. After the first step, as the result of the measurement, the overall state commutes with $Z_bZ_a$. After applying the Hadamard to the second qubit, the state commutes with $$H_aZ_bZ_aH_a^\dagger$$

which is exactly $Z_tX_a$. After the third step, the state commutes with $Z_aZ_c$ as required on the step 4.

Now it will be shown that the Controlled-Z gate was indeed performed. It is sufficient to consider the case when all three qubits are in a tensor product state. Suppose the qubit t is in state $\alpha_t|0\rangle+\beta_t|1\rangle$. After Step 1, the state of the qubits t,a becomes:

$$\alpha_t|00\rangle + |\beta_t 11\rangle$$

After Step 2 it is (up to normalization by $\sqrt{2}$):

$$\alpha_t|00\rangle + \alpha_t|01\rangle + \beta_t|10\rangle - \beta_t|11\rangle$$

Suppose qubit c is in state $\alpha_c|0\rangle+\beta_c|1\rangle$, then after Step 3, the state of all three qubits becomes:

$$\alpha_t\alpha_c|000\rangle + \alpha_t\beta_c|011\rangle + \beta_t\alpha_c|100\rangle - \beta_t\beta_c|111\rangle.$$

Finally, measuring $X_a$ transform the state into $$\alpha_t\alpha_c|0+0\rangle + \alpha_t\beta_c|0+1\rangle + \beta_t\alpha_c|1+0\rangle - \beta_t\beta_c|1+1\rangle.$$

One can see that the state of the second qubit is |+⟩ and the joint state of the first and the third qubits is $$\alpha_t\alpha_c|00\rangle + \alpha_t\beta_c|01\rangle + \beta_t\alpha_c|10\rangle - \beta_t\beta_c|11\rangle = CZ_{tc}((\alpha_b|0\rangle + \beta_t|1\rangle)\otimes(\alpha_t|0\rangle + \beta_c|1\rangle)).\ \square$$

Let one compare above program for Controlled-Z via measurement to version of MultipleTargetControlledZ operation applied to a tree with three vertexes c, t, a and edges (c,a) and (a,t):

| | |
|---|---|
| 1 | MeasurePlusOne ($Z_aZ_t/X_a$) # Fanout call corresponds to one operation |
| 2 | Controlled-$Z_{a,c}$ |
| 3 | MeasurePlusOne($X_a/Z_aZ_t$) |

The difference is that Hadamard followed by MeasurePlusOne($Z_aZ_t/Z_rX_a$) are in place of the call to Controlled-Z. It turns out that they perform a unitary similar to Controlled-Z.

Proposition 4.6. The following two operations $H_2$; MeasurePlusOne($Z_2Z_1/Z_1X_2$) map computational basis states |aab> to $(-1)^{ab}$|abb) for a, b zero or one.

Proof. Applying Hadamard gate transforms input state into:

$$|a\rangle\otimes\frac{|0\rangle+(-1)^a|1\rangle}{\sqrt{2}}\otimes b$$

The result of MeasurePlusOne($Z_3Z_2/Z_1X_2$) is:

$$\frac{I+Z_2Z_3}{2}\left|a\right\rangle\otimes(|0\rangle+(-1)^a\left|1\right\rangle)\otimes\left|b\right\rangle=(-1)^{ab}\left|abb\right\rangle.$$

This is because $(I+Z_2Z_3)/2$ projects on the span of |00⟩, |11⟩.

Using this operation, one can construct multi-target Controlled-Z gate that uses only joint measurements and single qubit operations.

TABLE 7

| Program for Multi-Target Controlled Z Gate Via Measurement | |
|---|---|
| 1 | # Input: V is the set of qubits, vertexes of a tree, E is the set of tree edges. |
| 2 | # \| \| \| \| Qubits with corresponding vertex degree > 1 are all in the plus state. |
| 3 | # \| \| \| \| Two non-root leaves in (V,E) are never connected to the same vertex. |
| 4 | # Effect; Multi-target controlled 2 gate is performed with root of the tree |
| 5 | # \| \| \| \| being a control and the rest of the leaves being targets. |
| 6 | # \| \| \| \| The rest of the vertexes (the ones with degree > 1) are returned back |
| 7 | # \| \| \| \| to a plus state. |
| 8 | operation MultipleTargetControlledZMeasure(V,E) |
| 9 | \| Let r be a root of V |
| 10 | \| Let (V',E') be a tree that is the result of removing all leaves r from (V,E) |
| 11 | \| Fanout(V',E') # Fanout gate from the root to the rest of the tree, see Table 5 |
| 12 | \| foreach leave v of (V,E) except the root # this loop has measurement depth 1 |
| 13 | \| \| Let (v,v') be an edge in E |

TABLE 7-continued

| Program for Multi-Target Controlled Z Gate Via Measurement |
| --- |
| I I $H_{v'}$ |
| I I MeasurePlusOne($Z_vZ_{v'}/Z_rX_{v'}$) |
| |
| I Two loops below can be performed in parallel in measurement depth 1 |
| I foreach leaf v' of (V',E') except the root |
| I I Let (v,v') be an edge in E |
| I I MeasurePlusOne($X_{v'}/Z_vZ_{v'}$) |
| |
| I foreach vertex v of (V',E') except the leaves |
| I I MeasurePlusOne($X_v/Z_vZ_r$) |

Proposition 4.7 (Low depth multiple target Controlled-Z by measurement). Let (V,E) be a tree such that all it leaves except the root are connected to a vertex of degree two. In other words, non of these leaves connected to the same vertex. Vertexes correspond to qubits. All non-leaf qubits are in a plus state. The program. Multiple TargetControlledZMeasure in Table 7 performs multiple target controlled Z gate with root being control and the rest of the leaves being targets. The measurement depth is at most the largest vertex degree plus two.

Proof. Consider how MultipleTargetControlledZMeasure operation acts on inputs from computational basis. For each non-root leaf, in other words a target of control operations there is a unique vertex connected to it in a plus state. The state of such a pair in the beginning of the computation is $|t_1\rangle|-\rangle$. One can order qubits in the following way. First goes the control qubit, next pairs corresponding to each target qubit and the qubit connected to it, next the rest of the qubits. The state of all the qubits in the beginning of the computation is:

$$|c\rangle t_1\rangle|+\rangle \ldots |t_n\rangle|+\rangle|+\rangle^{\otimes m}.$$

After applying the fanout operation, the state becomes:

$$|c\rangle t_1\rangle|c\rangle \ldots |t_n\rangle|c\rangle|c\rangle^{\otimes m}.$$

After the first foreach loop, according to Proposition 4.6, the state of the qubits becomes:

$$(-1)^{c(c_1+\ldots+c_n)}|c\rangle|t_1\rangle|t_1\rangle \ldots |t_n\rangle|t_n\rangle|c\rangle^{\otimes m}.$$

Now one can see that all the constraints in MeasurePlusOne operations in the last two for each loops are satisfied by the state above. States $|t_k\rangle|t_k\rangle$ satisfy $Z_vZ_{v'}$ constraint appearing in the second foreach loop and state $|c\rangle|c\rangle$ satisfy constraints $Z_vZ_{r'}$ appearing in the third foreach loop. After applying last two foreach loops the state of the qubits becomes $$(-1)^{c(c_1+\ldots+c_n)}|c\rangle|t_1\rangle|+\rangle \ldots |t_n\rangle|+\rangle|+\rangle^{\otimes m}.$$

as required.

The last two foreach loops can be performed in parallel because they involve different, qubits. Each of foreach loops has measurement depth one. Therefore the overall measurement, depth is the measurement depth of fanout operation plus two.

5. Embedding a Tree into 2D Grid of Qubits

All data qubits should be connected to an interface qubit with a path of ancillas. Thus, only a fraction of all qubits can be data qubits, with the rest being used as ancillas for connectivity. Given a rectangular field of qubits with a nearest neighbor (each internal qubit has 4 neighbors) architecture, the most data qubits one can get is ⅔ of the total number of qubits. This is because an ancilla (barring the edges) can have at most 2 data qubits attached to it with the other two connections being used up to attach to two other ancillas.

An ideal field configuration would be a 3×N grid of qubits where the center row consists of ancillas and top and bottom rows are data qubits. This would achieve a perfect ⅔ ratio of data qubits to total qubits.

Assuming N×N grid of qubits, the best configuration to achieve the highest data qubits ratio is a comb, where the second column and qubits 2 to N in every third row of qubits, starting from row #2, are ancillas. The first row is reserved for interface qubits, and the rest are data qubits. For the calculations here, interface qubits to be data qubits are counted. In this configuration the ratio of data qubits to total qubits is (2N−1)/3N, or ⅔−⅓N which is very close to ⅔.

The physical qubits have some probability of failure. Some of the qubits in a perfect rectangular grid may be dead (unsuitable for use). This not only decreases the number of available qubits, but also breaks connectivity between the remaining ones. For example, a path of ancillas may have a dead qubit in it, severing part of the line and breaking connectivity of the corresponding data qubits to the interface qubit.

An algorithm to create an optimal layout of qubits given an irregular qubit graph is desirable. However, such an algorithm will require non-polynomial execution time, making it impractical. In accordance with the disclosed technology, a heuristic-based algorithm is provided that is close to optimal.

Given a starting layout of a comb described above, the algorithm determines pieces of the graph disconnected from the interface qubits and tries to reconnect them enabling as many data qubits as possible. Starting from the interface qubit, one can mark continuous horizontal ancilla line segments as powered if they are connected to the interface. For each powered segment, one can queue all possible vertical routes that can extend from it. The routes that start at the ends of the segments go into the high-priority queue, and the rest into normal priority queue.

Then, for each queued route (starting with high priority ones), one can determine if this route connects a previously unpowered ancilla segment, and if yes, accept the route, mark ancilla segment as powered, and add more potential routes starting from the newly powered segment to the queues. Each route that was accepted, converts two data qubits into ancillas. This continues until the queues are empty. Routes at the ends of segments are preferable, because they provide power to one or two additional data qubits (next to the dead ancilla), while routes spawning from midsegments do not.

Each dead data qubit causes a loss of one data qubit in our ratio. Each dead ancilla causes two data qubits to be unpowered, and an ancilla segment to be detached. Reattaching the ancilla segment requires use of two data qubits and is likely to power back one of the disconnected qubits. Thus, each dead ancilla is likely to result in a loss of 3 data qubits.

6. Further Embodiments of Exemplary Multi-Target CNOT Gates

This section discloses further details for implementing multi-target CNOT gates in Majorana architectures as can be used in embodiments of the disclosed technology.

6.1. Introduction. In a measurement based architecture such as a lattice of Majorana qubits, a CNOT gate can implemented by a sequence of four measurements using an ancilla qubit. Applying this circuit sequentially, one can implement a multi-target CNOT gate with m targets in time linear in m, in depth 4 m. In this section, a constant depth implementation for a multi-target CNOT gate based on single-qubit, and two-qubit measurements is disclosed. The circuit has depth five in term of the number of levels of measurements (three two-qubit measurements and two single-qubit measurement). It requires one ancilla per target. This implementation is well suited for a grid of Majorana qubits.

The following circuits are made with single-qubit Pauli measurements and two-qubit Pauli measurements. Each measurement M is a followed by a Clifford update U(P) which means that the Clifford operation P is a classically controlled gate that is applied only if the outcome of the measurement M is 1. The update U(P) is represented in the circuit as a box identical to the preceding measurement box for M but it does not necessarily acts only on the support of M. We are particularly interested in the context of Majorana qubits. Then, single-qubit Clifford operations can be realized without any physical action on the qubits by a change of frame. In particular all Clifford updates are free. This is why the depth is considered as the number of levels of measurement.

6.2. CNOT gate by measurement. In this subsection, recall the implementation of a CNOT gate using single-qubit and two-qubit measurements and an ancilla qubit. FIG. 1 is a schematic block diagram 100 that represents the circuit realizing a CNOT gate between the top qubit and the bottom qubit. The middle qubit is an ancilla require for the CNOT gate. More specifically, the blue gates prepare the ancilla qubit, and the purple gates entangle it with the control qubit and the red gates act on the ancilla and the target qubits.

Denote by $|\psi\rangle-\alpha|0\rangle+\beta|1\rangle$ the control qubit (qubit 1) and let $|\varphi\rangle-\alpha'|0\rangle+\beta'|1)$ be the target qubit (qubit 3). One can check that the circuit of FIG. 1 realizes a CNOT gate. In order to simplify the calculation, one can show that without the II-conjugation on the last qubit, the circuit realizes the CZ-gate. Adding the two H gate provides the CNOT gate.

The first measurement $M_X$, followed by the update $U(Z_2)$ in case of outcome 1, prepares the ancilla qubit in the state $|+\rangle$. The combined state of qubits 1 and 2 is then $$|\psi_0\rangle=\alpha|00\rangle+\alpha|01\rangle+\beta|10\rangle+\beta|11\rangle.$$

Measuring $Z_1Z_2$ with outcome 0, projects the state of qubit 1 and 2 onto the state $$|\psi_1\rangle=\alpha|00\rangle+\beta|11\rangle.$$

If the outcome 1 is obtained, one gets the state $\alpha|01\rangle+\beta|10\rangle$ that is mapped onto $|\psi_1\rangle$ by the update $U(X_2)$.

The gate $H_2$ leads to $|\psi_2\rangle=\alpha|00\rangle+\alpha|01\rangle+\beta|10\rangle+(-1)\beta|11\rangle$ on the first two qubits, and (without considering $H_3$) the three-qubits state is then $$|\psi_2\rangle=\alpha\alpha'|000\rangle+\alpha\alpha'|010\rangle+\beta\alpha'|100\rangle+(-1)\beta\alpha'|110\rangle+\alpha\beta'|001\rangle+\alpha\beta'|011\rangle+\beta\beta'|101\rangle+(-1)\beta\beta'|111\rangle$$

If the outcome of $M_{Z_2Z_3}$ is 0, then the post-measurement state is $$|\psi_3\rangle=\alpha\alpha'|000\rangle+\beta\alpha'|100\rangle+\alpha\beta'|011\rangle+(-1)\beta\beta'|111\rangle$$

If the outcome 1 is measured, the state after measurement is then $$\alpha\alpha'|010\rangle+(-1)\beta\alpha'|110\rangle+\alpha\beta'|001\rangle+\beta\beta'|101\rangle$$

that one can map onto $|\psi_3\rangle$ by the update $U(Z_1X_2)$.

Finally, get rid of the ancilla by measuring X. Assuming that the outcome is 0, one obtains the following state on qubit 1 and 3 after $M_X$.

$$|\psi_4\rangle=\alpha\alpha'|00\rangle+\beta\alpha'|10\rangle+\alpha\beta'|01\rangle+(-1)\beta\beta'|11\rangle$$

We recognize the control-Z gate applied to $|\psi\rangle$ and $|\varphi\rangle$. If the outcome of $M_X$ is 1, one gets the state $$\alpha\alpha'|00\rangle+\beta\alpha'|10\rangle+(-1)\alpha\beta'|01\rangle+\beta\beta'|11\rangle.$$

A correction $U(Z_3)$ is required to map it onto $|\psi_4\rangle$. In the CNOT gate, this correction is conjugated by H and becomes $U(X_3)$.

This proves that the circuit of FIG. 1 realizes the CNOT gate.

6.3. Multi-target CNOT gate. A multi-target CNOT gate applies a X gate to a set of m qubits $q_1, \ldots, q_m$, controlled on the state of a unique control qubit $q_0$. Naively, it can be realized by a sequence of m CNOT gates, CNOT($q_0$, $q_i$) for i=1, . . . , m. The depth of the multi-target CNOT gate is therefore at most linear in the number of targets. In this section, it is shown how to realize a multi-target gate in constant depth using one ancilla qubit for each target. While the same ancilla qubit can be reused for the sequential implementation of m CNOT gates, m ancillas are consumed for a, constant depth implementation.

Figure 2:
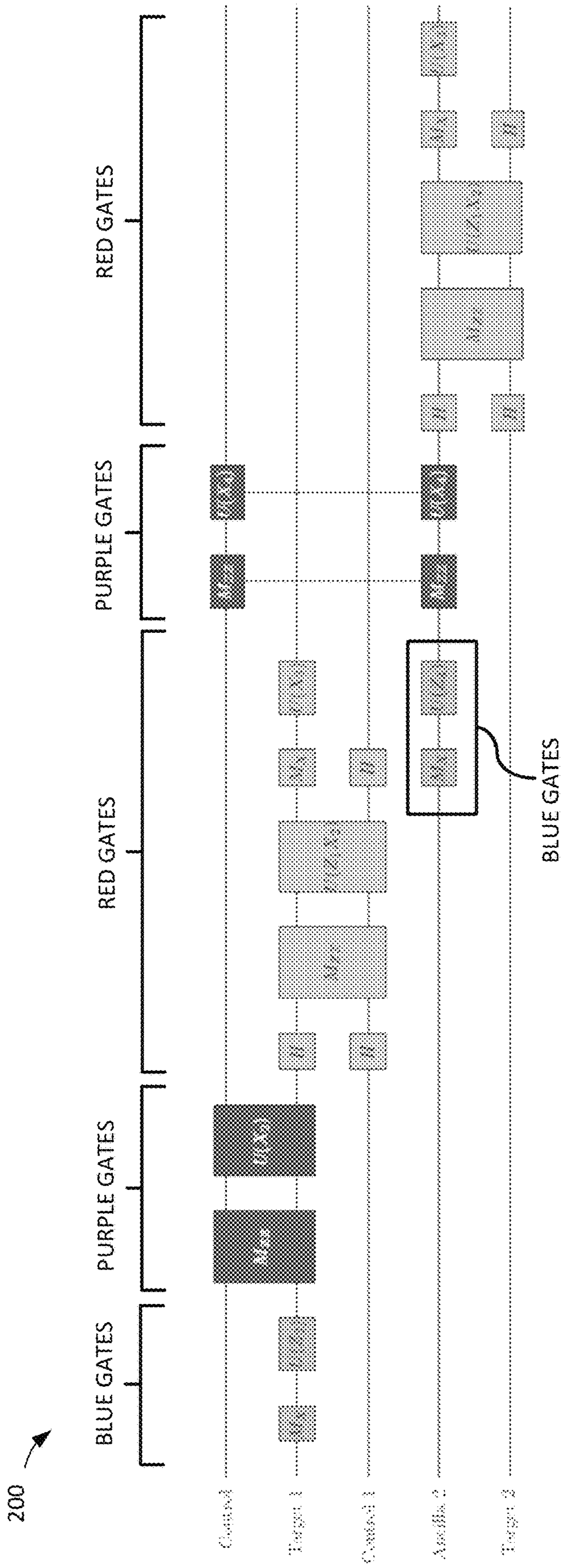
FIG. 2 is a schematic block diagram showing an example of providing a multi-target CNOT gate by measurement.
Figure 3:
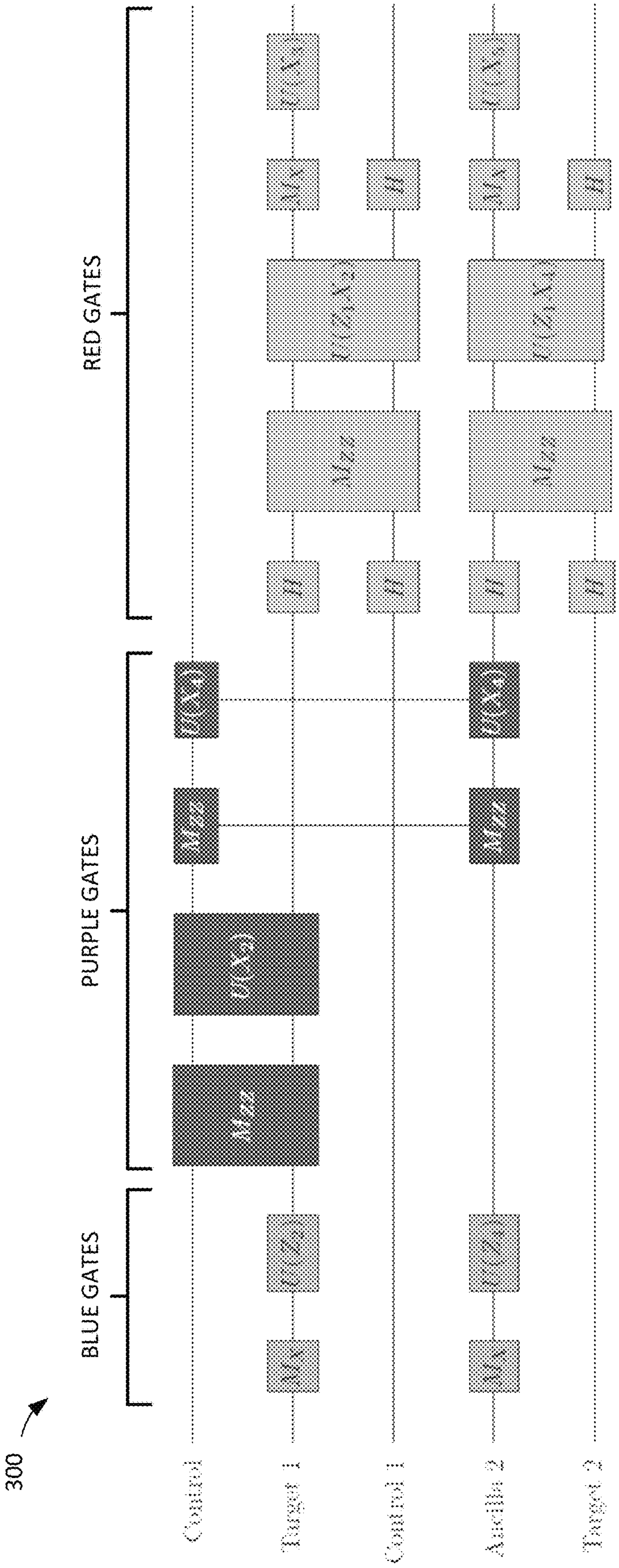
FIG. 3 is a schematic block diagram illustrating a modified version of FIG. 2 after moving the purple measurement $M_{Z_1Z_4}$ to the left to parallelize the final red block between the ancillas and the targets.
Figure 4:
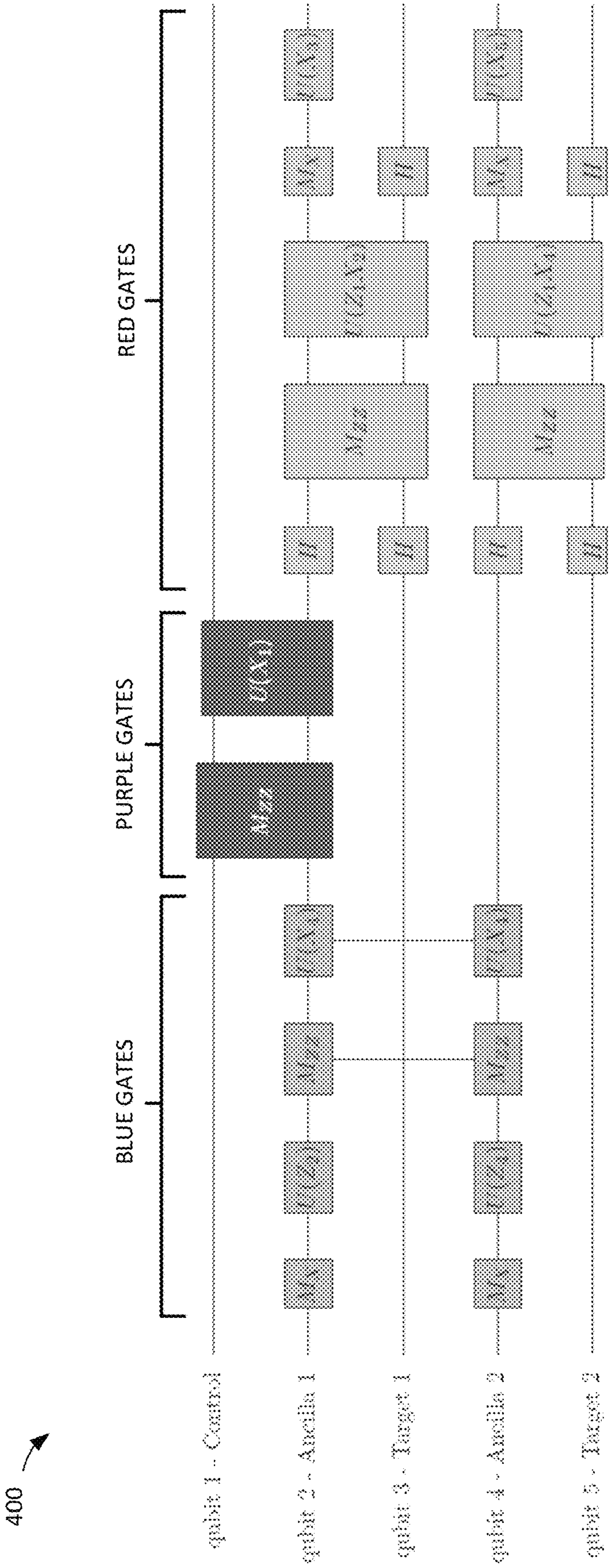
FIG. 4 is a schematic block diagram illustrating further modifying the initial measurements to parallelize the purple block between the control qubit and the ancillas (The effect of this parallelization appears only when more than two targets are present).

The transformation of the sequential implementation used to reduce the depth of the circuit to a constant is shown in FIGS. 2-4 in the case of a two-targets CNOT gate.

FIG. 2 is a schematic block diagram 200 showing an example of providing a multi-target CNOT gate by measurement. In particular, block diagram 200 illustrates an example sequential application of the CNOT circuit. FIG. 3 is a schematic block diagram 300 illustrating a modified version of block diagram 200 after moving the purple measurement $M_{Z_1Z_4}$ to the left to parallelize the final red block between the ancillas and the targets. FIG. 4 is a schematic block diagram 400 illustrating further modifying the initial measurements to parallelize the purple block between the control qubit and the ancillas (The effect of this parallelization appears only when more than two targets are present).

As illustrated, this transformation can be performed in two steps. First, one moves the join measurement $M_{ZZ}$ between the control qubit and the ancillas to the past. This allows one to parallelize the final block of the circuit acting on the ancillas and the targets. In the second step, one can replace the m measurements $M_{Z_{q0}Z_{qi}}$ involving the control qubit by a single measurement involving the control qubit $q_0$ and m−1 measurements on the ancilla qubits that can be realized in depth two.

Figure 5:
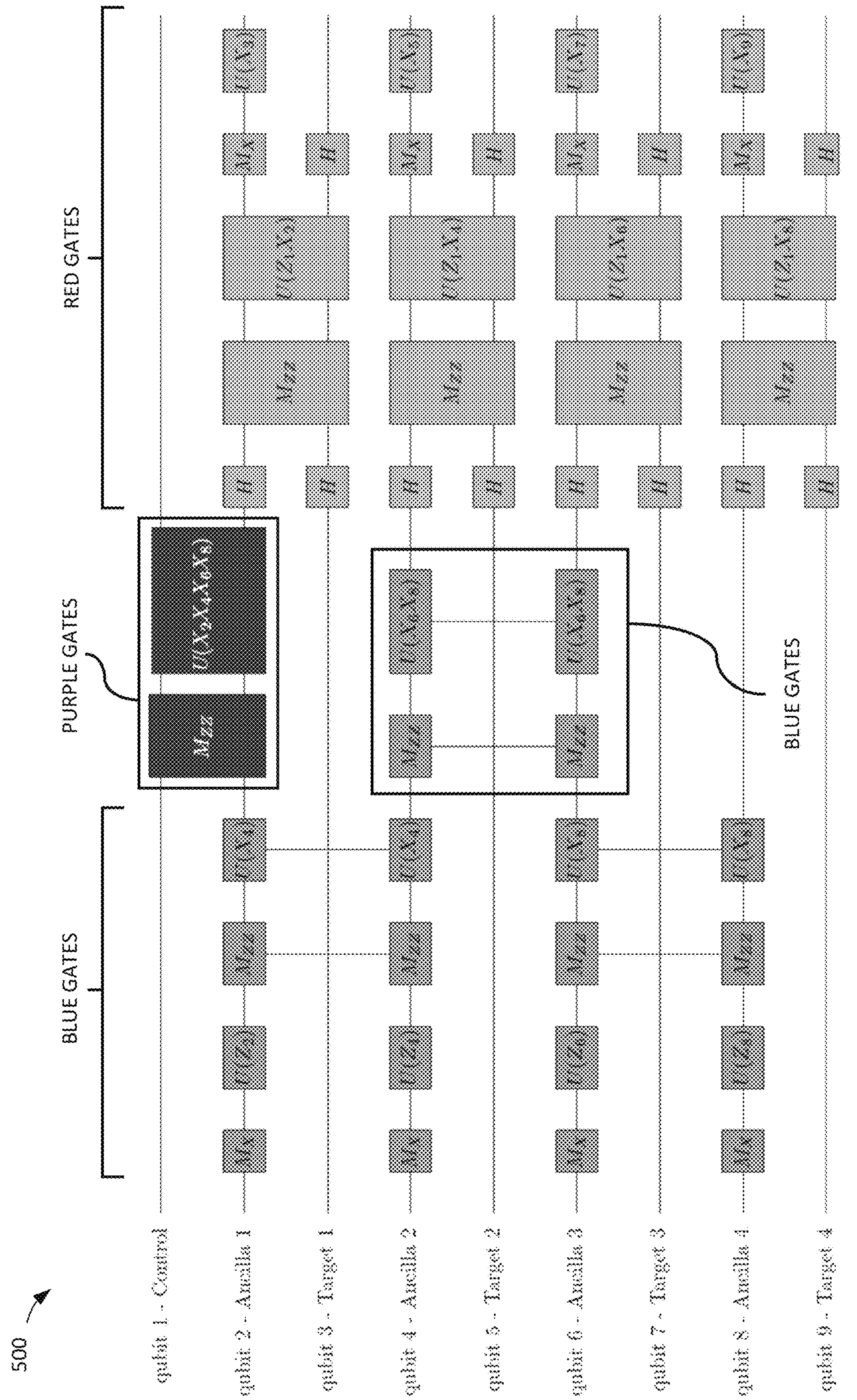
FIG. 5 is a schematic block diagram of a further general circuit in accordance with an embodiment of the disclosed technology.

The general circuit, represented in schematic block diagram 500 of FIG. 5 for four targets works as follows:

(i) [Ancilla preparation (blue)] Prepare a m-qubits cat state $|0 \ldots 0\rangle + |1 \ldots 1\rangle$ over the m ancilla qubits $\alpha_1, \ldots, \alpha_m$ by measuring $Z_{\alpha_1}Z_{\alpha_2}$, $Z_{\alpha_2}$, $Z_{\alpha_2}Z_{\alpha_3}$, . . . , $Z_{\alpha_{m-1}}Z_{\alpha_m}$. This can be done in two layers of measurements (followed by updates).

(ii) [Control block (purple)] Entangle the ancillas with the control qubit $q_0$ by measurement of $Z_{q0}Z_{a1}$. The update $U(X_{\alpha_1}X_{\alpha_2} \ldots X_{\alpha_m})$ is applied in case of non-zero outcome.

(iii) [Target block (red)] Apply the target block of the standard CNOT by measurement in parallel to all the targets.

In order to check that this circuit realizes the multi-target CNOT as claimed, it suffices to check that the circuit maps any Pauli operators onto the same Pauli operator as the multi-target CNOT gate. Given a Pauli matrix P, denote by $P_C$ the Pauli operator acting as P on the control qubit and acting trivially on all other qubits. Similarly $P_{\alpha_i}$ acts on the i-th ancilla and $P_{T_i}$ on the i-th target. The multi-target CNOT gate is fully characterized by its action on Pauli operators as follows:

$$X_C \mapsto X_C \prod_{i=1}^{m} X_{T_i}$$

$$Z_C \mapsto Z_C$$

$$X_{T_i} \mapsto X_{T_i}$$

$$Z_{T_i} \mapsto Z_{T_i} Z_C$$

Figure 6:
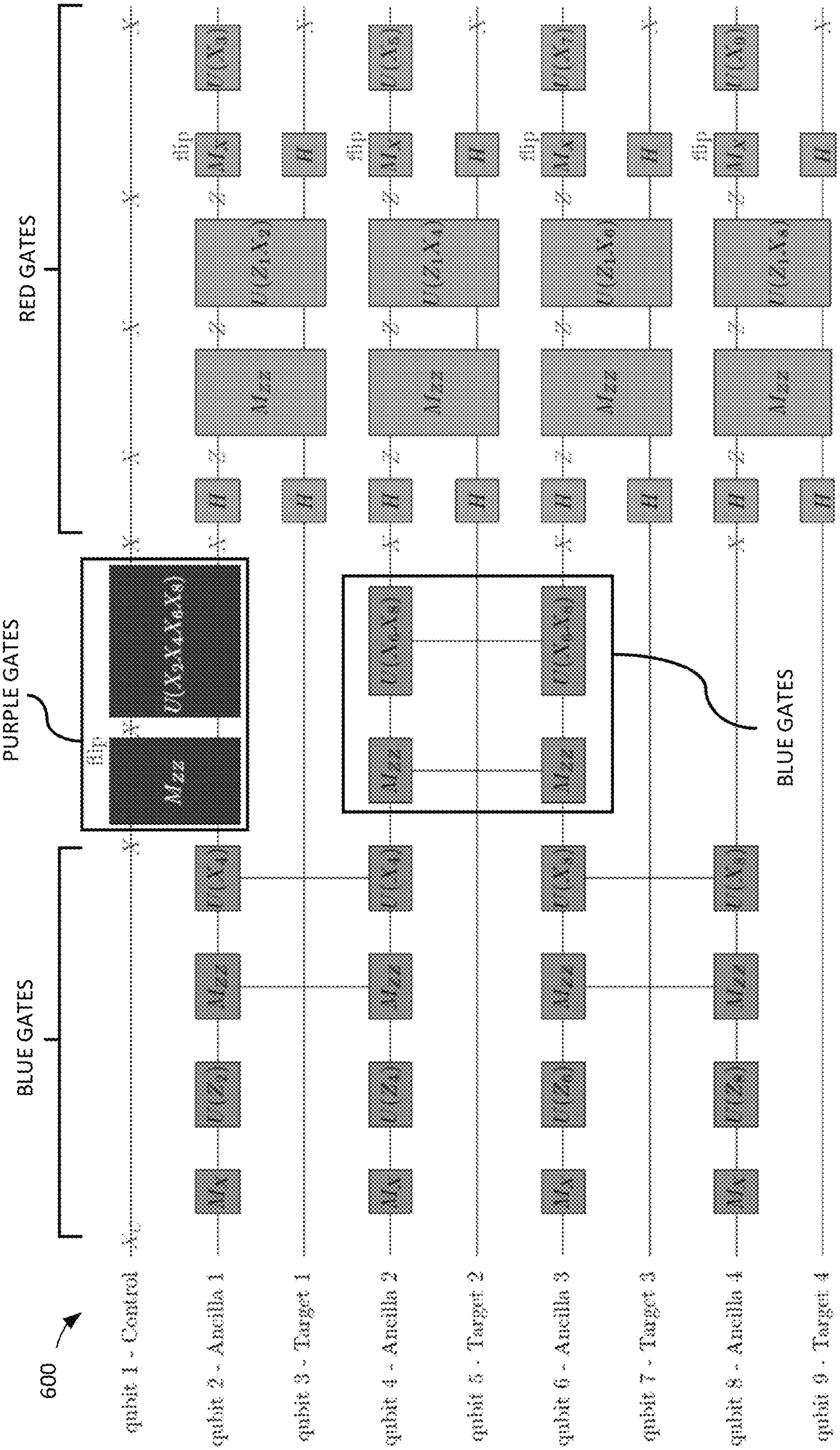
FIG. 6 is a schematic block diagram of an example circuit that propagates a Pauli operator $X_C$.

One can easily check that the circuit satisfies these identities by propagating these Pauli operators through the circuit. For instance, one can propagate the operation $X_C$ through the circuit in FIG. 6. In particular, FIG. 6 is a schematic block diagram 600 of a circuit that propagates the Pauli operator $X_C$ through the circuit. One can check that the circuit maps $X_C$ onto $$X_C \prod_{i=1}^{m} X_{T_i}$$

as expected

This proves that it implements the desired multi-target CNOT operation.

6.4. Two-dimensional layout. This multi-target CNOT gate can be implemented in a grid of Majorana qubits where all single-qubit measurement $M_X$, $M_Z$ are available, as well as two-qubit measurement $M_{P_1P_2}$ of Pauli operators $P_1P_2$ between neighbors qubits.

Figure 7:
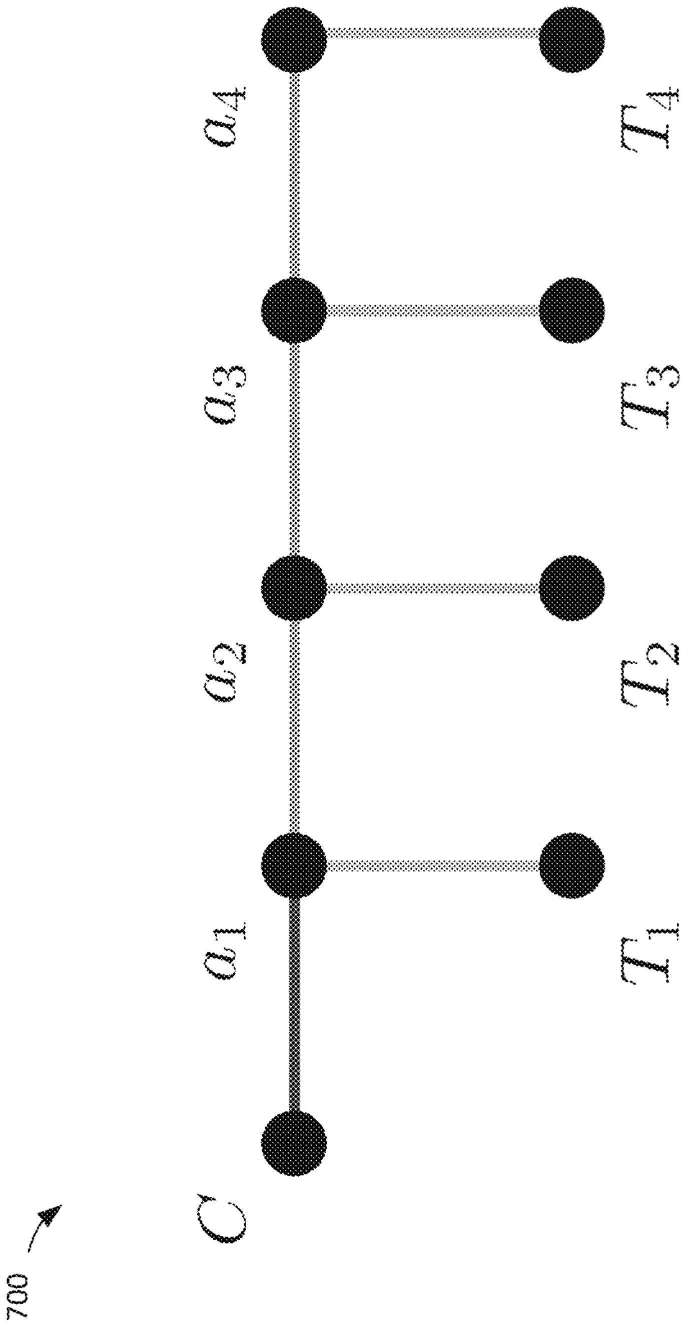
FIG. 7 is a block diagram representing the planar layout for the multi-target CNOT gate of FIG. 8.

For instance, one can consider a line of m ancilla qubits where the cat state is prepared, connected to the control qubit through one of its endpoints. Each ancilla can reach a target qubit placed directly below it. This allows for a local implementation of the multi-target CNOT gate described in this note. FIG. 7 is a block diagram 700 representing the planar layout for the multi-target CNOT gate of FIG. 6.

7. Example Embodiments

In this section, example methods for performing aspects of the disclosed embodiments are disclosed. The particular embodiments described should not be construed as limiting, as the disclosed method acts can be performed alone, in different orders, or at least partially simultaneously with one another. Further, any of the disclosed methods or method acts can be performed with any other methods or method acts disclosed herein.

Figure 8:
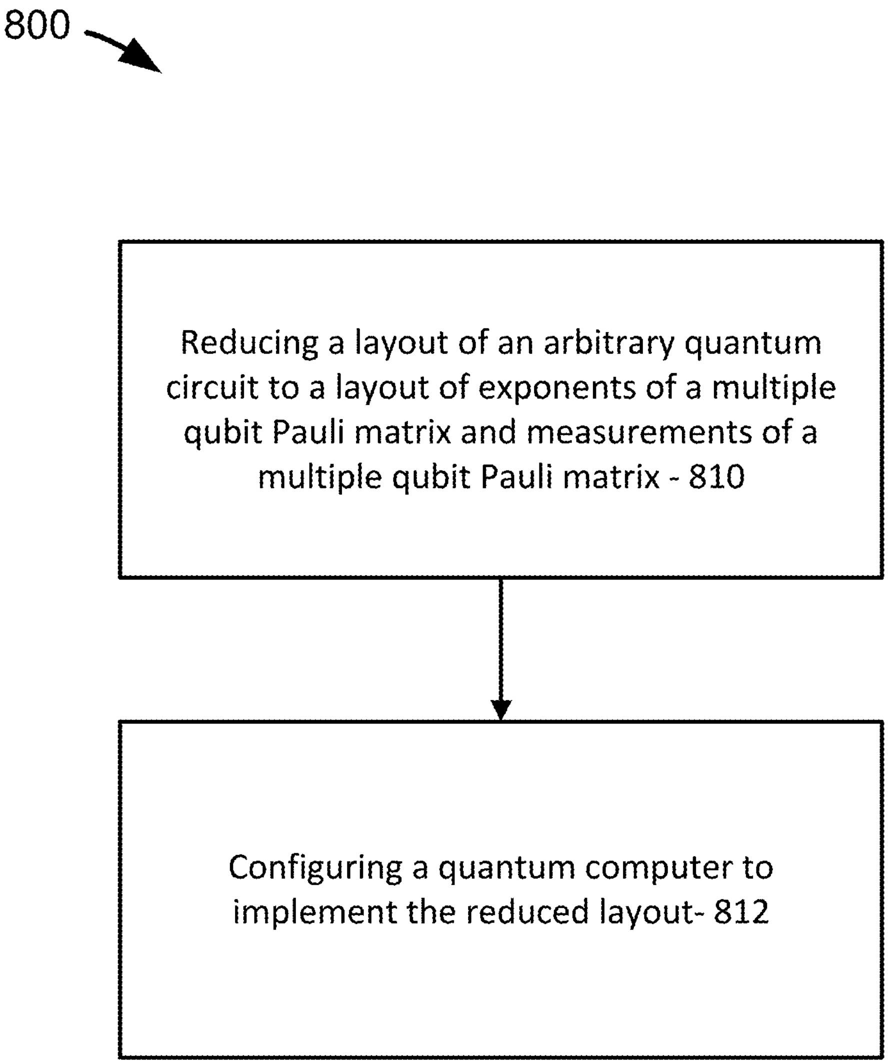
FIG. 8 is a flow chart showing a general method for performing embodiments of the disclosed technology.

FIG. 8 is an example method for performing a layout reduction technique for fault-tolerant, quantum computing in accordance with an embodiment of the disclosed technology. In particular embodiments, the method is performed by one or more classical computing devices, at least some of which are in a configuration that can operate a quantum computer.

At 810, a layout of an arbitrary quantum circuit is reduced to a layout of exponents of a multiple qubit Pauli matrix and measurements of a multiple qubit Pauli matrix.

At 812, a quantum computer is configured to implement the reduced layout.

In particular implementations, qubits of the quantum computer comprise data qubits, interface qubits, and ancilla qubits. In further implementations, a graph of qubit connectivity satisfies a condition of providing an ancilla-path from one or more data qubits to the interface qubits.

Figure 9:
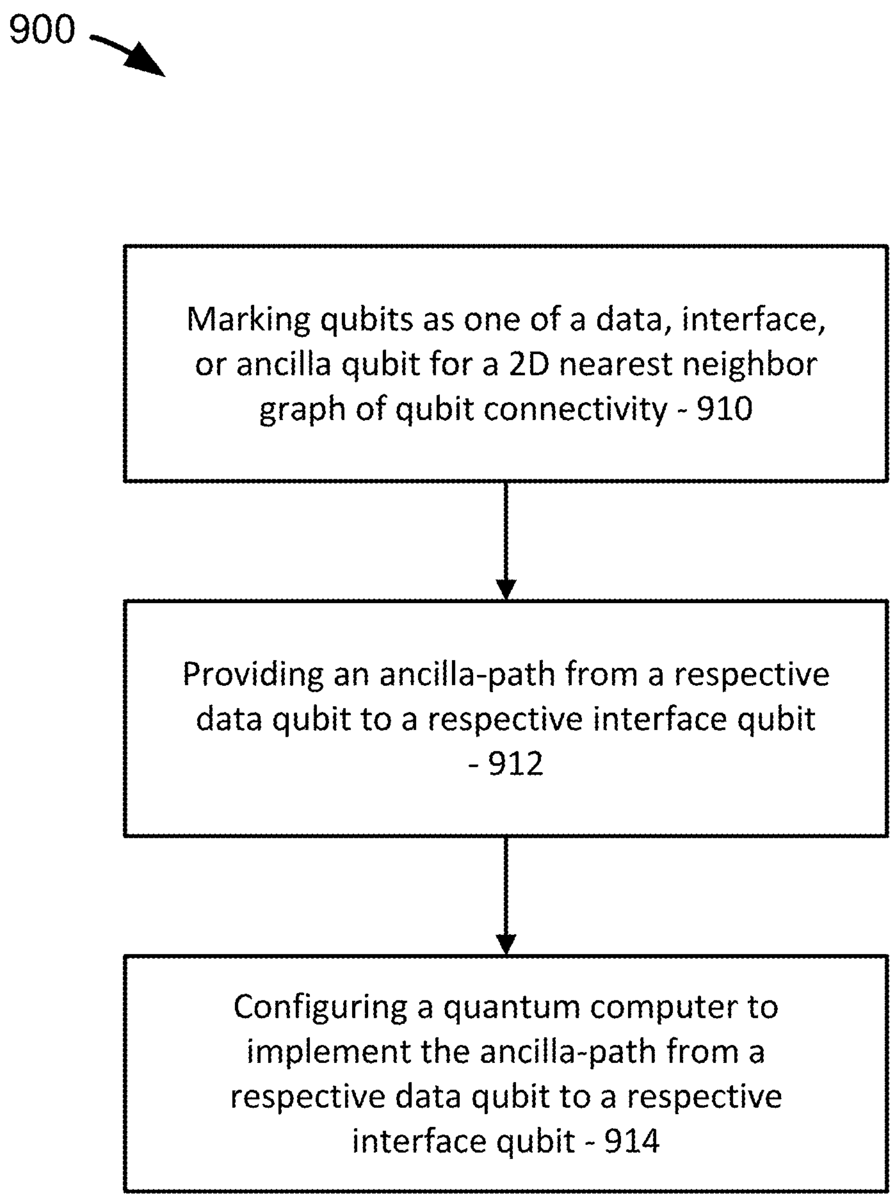
FIG. 9 is a flow chart showing a further general method for performing embodiments of the disclosed technology.

FIG. 9 is an example method for performing a layout technique for fault-tolerant quantum computing in accordance with an embodiment of the disclosed technology. In particular embodiments, the method is performed by one or more classical computing devices, at least some of which are in a configuration that can operate a quantum computer.

At 910, qubits are marked as one of a data, interface, or ancilla qubit for a 2D nearest neighbor graph of qubit connectivity.

At 912, an ancilla-path is provided from a respective data qubit to a respective interface qubit.

At 914, a quantum computer is configured to implement the ancilla-path from a respective data qubit to a respective interface qubit.

In certain implementations, the method accounts for and avoids any broken qubits and satisfies a condition of providing an ancilla-path from a data qubit to the interface qubits.

Any of the methods described above can be performed in a system, comprising a quantum computing device; and one or more classical-computing devices, at least some of the one or more classical computing devices being programmed to perform any of the disclosed methods.

Additionally, any of the methods described above can be implemented as one or more classical-computer-readable-media storing classical-computer-executable instructions, which when executed by a classical computer cause the classical computer to perform any of the disclosed methods.

Further embodiments comprise, a quantum circuit configured to apply an exponent of a multiple qubit Pauli matrix and measure a multiple qubit Pauli matrix. In some implementations, an ancilla-path is provided from data qubits to the interface qubits. In further implementations, the quantum circuit has a depth not depending on the number of vertexes. In some implementations, the quantum circuit uses single or low-depth multiple-target CNOT gates as a sub-circuits.

Some embodiments, comprise a quantum circuit configured to (a) provide a multi-target CNOT gate using a single-qubit and two-qubit Pauli measurements and single qubit Clifford gates; or (b) provide a multi-target CNOT gate using a single-qubit, Pauli measurements, single qubit Clifford gates and Controlled-Z gates. In some implementations, the quantum circuit provides a multi-target CNOT gate using a single-qubit and two-qubit Pauli measurements and single qubit Clifford gates, wherein the quantum circuit works with qubits for which a graph of qubit connectivity satisfies a condition of providing an ancilla-path from a target qubit to the control qubit. In further implementations, the quantum circuit provides a multi-target CNOT gate using a single-qubit and two-qubit Pauli measurements and single qubit Clifford gates, wherein the quantum circuit, has a depth not depending on the number of vertexes. In some implementations, the quantum circuit is configured to provide a multi-target CNOT gate using a single-qubit, Pauli measurements, single qubit Clifford gates and Controlled-Z gates, and wherein the quantum circuit works with qubits for which graph of qubit connectivity satisfies a condition of providing an ancilla-path from a target qubit to the control qubit. In further implementations, the quantum circuit is configured to provide a multi-target CNOT gate using a single-qubit, Pauli measurements, single qubit Clifford gates and Controlled-Z gates, wherein the quantum circuit has a depth not depending on the number of vertexes.

A further embodiment is a method that comprises implementing a product of exponents of commuting multiple-qubit Pauli matrices in low depth where non-clifford gates can be executed in parallel.

An additional embodiment is a quantum circuit for providing a multi-target CNOT gate using a single-qubit and two-qubit Pauli measurements. In some implementations, the quantum circuit further comprises a 2-d nearest neighbor architecture. In certain implementations, the quantum circuit comprises a 3-N grid of qubits with a center row or center column of data qubits, each respective data qubit further being directly connected to two ancilla qubits. In some implementations, the quantum circuit comprises a comb architecture with a center row or center column of data qubits, each respective data qubit further being directly connected to one ancilla qubits to thereby form the comb architecture. In certain implementations, the quantum circuit is a low-constant-depth quantum circuit. In some implementations, the quantum circuit has a depth equal to a largest vertex degree of a tree describing the quantum circuit.

A further embodiment comprises a quantum circuit for computing an exponent of a multiple qubit Pauli matrix. In some implementations, the multiple qubit Pauli matrix is a two-qubit Pauli matrix. In certain implementations, the quantum circuit is a low-constant-depth quantum circuit. In further implementations, the quantum circuit has a depth equal to a largest vertex degree of a tree describing the quantum circuit.

An additional embodiment is a method comprising: reducing a layout of an arbitrary quantum circuit to a layout of exponents of a multiple qubit Pauli matrix.

A further embodiment is a method comprising implementing a product of exponents of commuting multiple-qubit Pauli matrices in low depth where non-clifford gates can be executed in parallel.

An additional embodiment is a computer-implemented method that builds a data/ancilla qubit layout for a given graph of qubit connectivity and satisfies a condition of providing an ancilla-path from every data qubit to the interface qubits. In some implementations, the method accounts for and avoids any broken qubits.

Again, any of the methods described above can be implemented as one or more classical-computer-readable-media storing classical-computer-executable instructions, which when executed by a classical computer cause the classical computer to perform any of the disclosed methods.

8. Example Computing Environments

Figure 10:
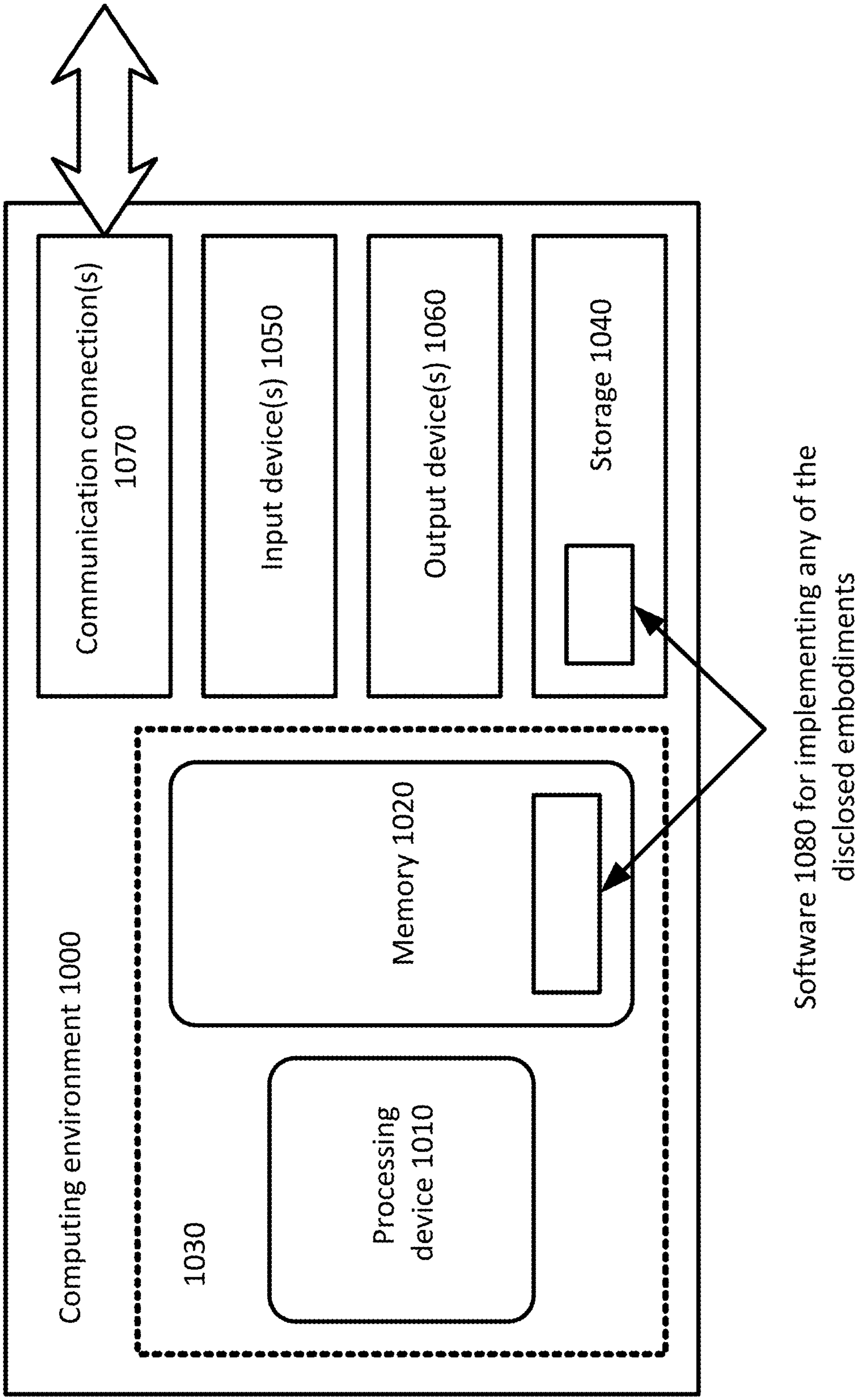
FIG. 10 illustrates a generalized example of a suitable classical computing environment in which aspects of the described embodiments can be implemented.

FIG. 10 illustrates a generalized example of a suitable classical computing environment 1000 in which several of the described embodiments can be implemented. The computing environment 1000 is not, intended to suggest any limitation as to the scope of use or functionality of the disclosed technology, as the techniques and tools described herein can be implemented in diverse general-purpose or special-purpose environments that have computing hardware.

With reference to FIG. 10, the computing environment 1000 includes at least one processing device 1010 and memory 1020. In FIG. 10, this most basic configuration 1030 is included within a dashed line. The processing device 1010 (e.g., a CPU or microprocessor) executes computer-executable instructions. In a multi-processing system, multiple processing devices execute computer-executable instructions to increase processing power. The memory 1020 may be volatile memory (e.g., registers, cache, RAM, DRAM, SRAM), non-volatile memory (e.g., ROM, EEPROM, flash memory), or some combination of the two. The memory 1020 stores software 1080 implementing tools for performing any of the layout techniques for fault-tolerant quantum computers disclosed herein, using a classical computer and/or quantum computer. For example, the memory 1020 can store software for controlling a quantum circuit to implement an embodiment of the disclosed approximation technique. The memory 1020 can also store software 1080 for synthesizing, generating (or compiling), and/or controlling quantum circuits as described herein.

The computing environment can have additional features. For example, the computing environment 1000 includes storage 1040, one or more input devices 1050, one or more output devices 1060, and one or more communication connections 1070. An interconnection mechanism (not shown), such as a bus, controller, or network, interconnects the components of the computing environment 1000. Typically, operating system software (not shown) provides an operating environment for other software executing in the computing environment 1000, and coordinates activities of the components of the computing environment 1000.

The storage 1040 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 1000. The storage 1040 can also store instructions for the software 1080 implementing tools for performing any of the layout techniques for fault-tolerant quantum computers disclosed herein using a classical computer and/or quantum computer. For example, the memory 1020 can store software for controlling a quantum circuit to implement an embodiment of the disclosed layout techniques. The storage 1040 can also store instructions for the software 1080 for synthesizing, generating (or compiling), and/or controlling quantum circuits as described herein.

The input device(s) 1050 can be a touch input device such as a keyboard, touchscreen, mouse, pen, trackball, a voice input device, a scanning device, or another device that provides input to the computing environment 1000. The output device(s) 1060 can be a display device (e.g., a computer monitor, laptop display, smartphone display, tablet display, netbook display, or touchscreen), printer, speaker, or another device that provides output from the computing environment 1000.

The communication connection(s) 1070 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods, quantum circuit control techniques, or compilation/synthesis techniques can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 1020 and/or storage 1040, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that, perform particular tasks or implement particular abstract data types. The functionality of the program modules may be combined or split between program modules as desired in various embodiments. Computer-executable instructions for program modules may be executed within a local or distributed computing environment.

Figure 11:
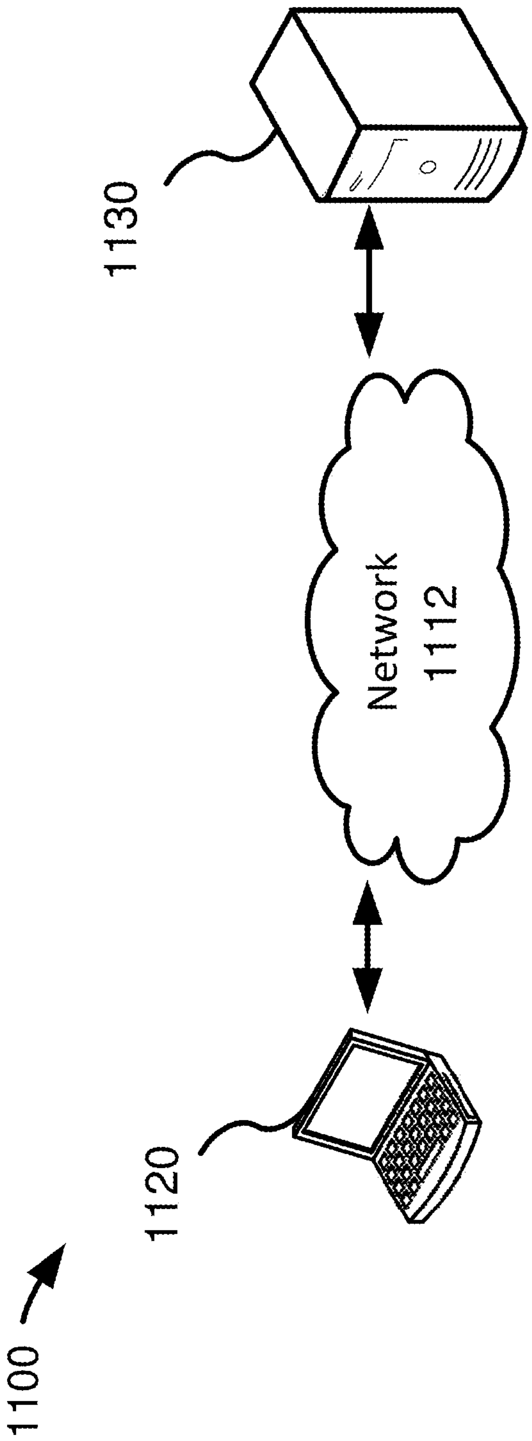
FIG. 11 shows an example of a possible network topology (e.g., a client-server network) for implementing a system according to the disclosed technology.

An example of a possible network topology 1100 (e.g., a client-server network) for implementing a system according to the disclosed technology is depicted in FIG. 11. Networked computing device 1120 can be, for example, a computer running a browser or other software connected to a network 1112. The computing device 1120 can have a computer architecture as shown in FIG. 10 and discussed above. The computing device 1120 is not limited to a traditional personal computer but can comprise other computing hardware configured to connect to and communicate with a network 1112 (e.g., smart phones, laptop computers, tablet, computers, or other mobile computing devices, servers, network devices, dedicated devices, and the like). Further, the computing device 1120 can comprise an FPGA or other programmable logic device. In the illustrated embodiment, the computing device 1120 is configured to communicate with a computing device 1130 (e.g., a remote server, such as a server in a cloud computing environment) via a network 1112. In the illustrated embodiment, the computing device 1120 is configured to transmit input, data to the computing device 1130, and the computing device 1130 is configured to implement, a quantum circuit control technique according to any of the disclosed embodiments and/or a circuit generation or compilation/synthesis methods for generating quantum circuits for use with any of the techniques disclosed herein. The computing device 1130 can output results to the computing device 1120. Any of the data received from the computing device 1130 can be stored or displayed on the computing device 1120 (e.g., displayed as data on a graphical user interface or web page at the computing devices 1120). In the illustrated embodiment, the illustrated network 1112 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 1112 can be the Internet or a similar public network and operate using an appropriate protocol (e.g., the HTTP protocol).

Figure 12:
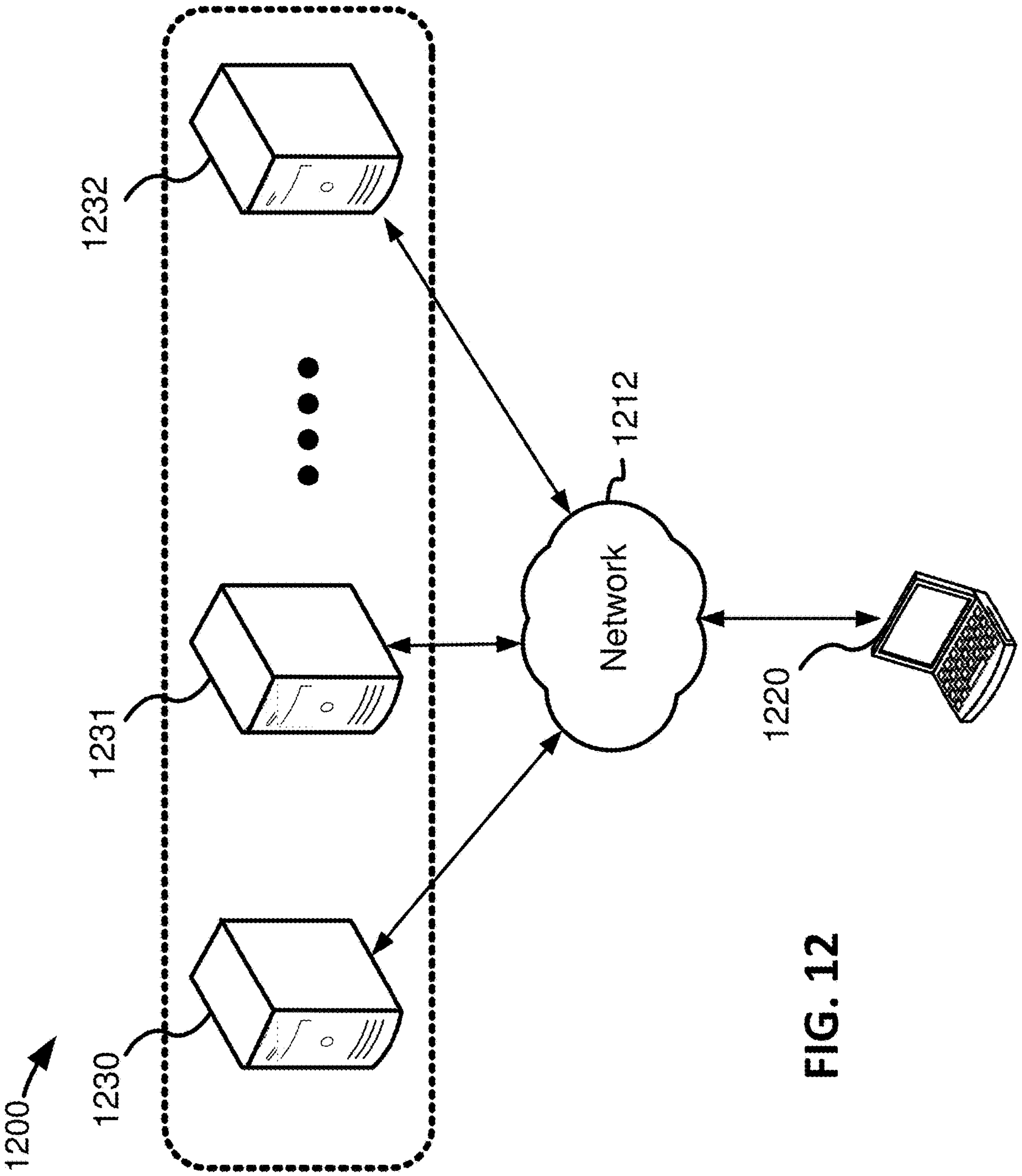
FIG. 12 shows another example of a possible network topology (e.g., a distributed computing environment) for implementing a system according to the disclosed technology.

Another example of a possible network topology 1200 (e.g., a distributed computing environment) for implementing a system according to the disclosed technology is depicted in FIG. 12. Networked computing device 1220 can be, for example, a computer running a browser or other software connected to a network 1212. The computing device 1220 can have a computer architecture as shown in FIG. 10 and discussed above. In the illustrated embodiment, the computing device 1220 is configured to communicate with multiple computing devices 1230, 1231, 1232 (e.g., remote servers or other distributed computing devices, such as one or more servers in a cloud computing environment) via the network 1212. In the illustrated embodiment, each of the computing devices 1230, 1231, 1232 in the computing environment 1200 is used to perform at least a portion of a quantum circuit control technique according to any of the disclosed embodiments and/or a circuit generation or compilation/synthesis methods for generating quantum circuits for use with any of the techniques disclosed herein. In other words, the computing devices 1230, 1231, 1232 form a distributed computing environment in which the quantum circuit control and/or generation/compilation/synthesis processes are shared across multiple computing devices. The computing device 1220 is configured to transmit input data to the computing devices 1230, 1231, 1232, which are configured to distributively implement such as process, including performance of any of the disclosed methods or creation of any of the disclosed circuits, and to provide results to the computing device 1220. Any of the data received from the computing devices 1230, 1231, 1232 can be stored or displayed on the computing device 1220 (e.g., displayed as data on a graphical user interface or web page at the computing devices 1220). The illustrated network 1212 can be any of the networks discussed above with respect to FIG. 11.

Figure 13:
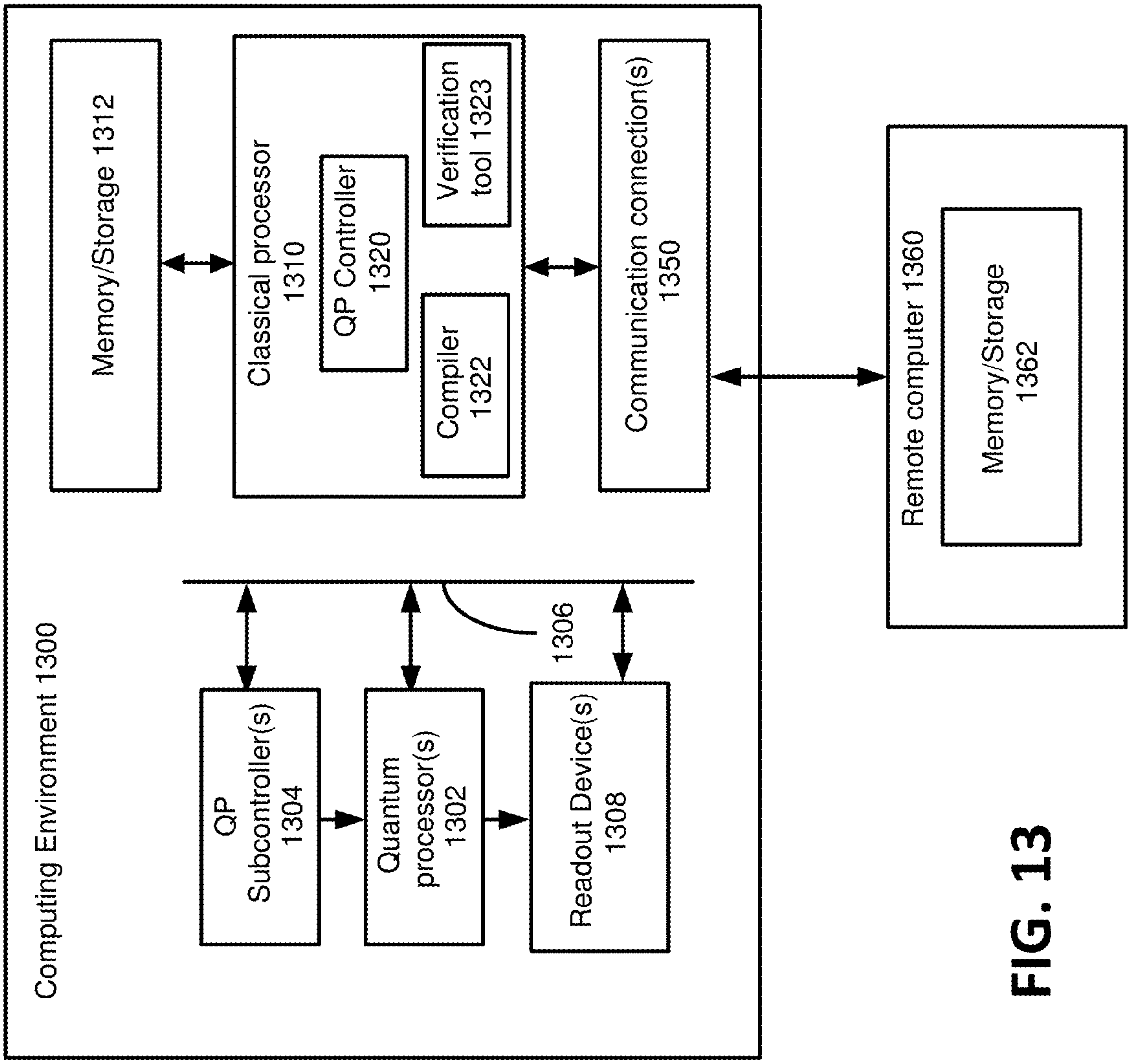
FIG. 13 shows an exemplary system for implementing the disclosed quantum-computing technology.

With reference to FIG. 13, an exemplary system for implementing the disclosed technology includes computing environment 1300. In computing environment 1300, a compiled quantum computer circuit description (including quantum circuits generated by any of the disclosed layout techniques) can be used to program (or configure) one or more quantum processing units such that the quantum processing unit(s) implement the circuit, described by the quantum computer circuit, description.

The environment 1300 includes one or more quantum processing units 1302 and one or more readout device(s) 1308. The quantum processing unit(s) execute quantum circuits that are precompiled and described by the quantum computer circuit description. The quantum processing unit (s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 1306 at the control of quantum processor controller 1320. The quantum processor controller (QP controller) 1320 can operate in conjunction with a classical processor 1310 (e.g., having an architecture as described above with respect to FIG. 10) to implement the desired quantum computing process. In the illustrated example, the QP controller 1320 further implements the desired quantum computing process via one or more QP subcontrollers 1304 that are specially adapted to control a corresponding one of the quantum processor(s) 1302. For instance, in one example, the quantum controller 1320 facilitates implementation of the compiled quantum circuit by sending instructions to one or more memories (e.g., lower-temperature memories), which then pass the instructions to low-temperature control unit(s) (e.g., QP subcontroller(s) 1304) that transmit, for instance, pulse sequences representing the gates to the quantum processing unit(s) 1302 for implementation. In other examples, the QP controller(s) 1320 and QP subcontroller(s) 1304 operate to provide appropriate magnetic fields, encoded operations, or other such control signals to the quantum processor(s) to implement the operations of the compiled quantum computer circuit description. The quantum controlled s) can further interact with readout devices 1308 to help control and implement the desired quantum computing process (e.g., by reading or measuring out data results from the quantum processing units once available, etc.)

With reference to FIG. 13, compilation is the process of translating a high-level description of a quantum algorithm into a quantum computer circuit description comprising a sequence of quantum operations or gates, which can include the circuits as disclosed herein. The compilation can be performed by a compiler 1322 using a classical processor 1310 (e.g., as shown in FIG. 10) of the environment 1300 which loads the high-level description from memory or storage devices 1312 and stores the resulting quantum computer circuit description in the memory or storage devices 1312.

In other embodiments, compilation and/or verification can be performed remotely by a remote computer 1360 (e.g., a computer having a computing environment as described above with respect to FIG. 10) which stores the resulting quantum computer circuit description in one or more memory or storage devices 1362 and transmits the quantum computer circuit description to the computing environment 1300 for implementation in the quantum processing unit(s) 1302. Still further, the remote computer 1300 can store the high-level description in the memory or storage devices 1362 and transmit the high-level description to the computing environment 1300 for compilation and use with the quantum processor(s). In any of these scenarios, results from the computation performed by the quantum processor (s) can be communicated to the remote computer after and/or during the computation process. Still further, the remote computer can communicate with the QP controller(s) 1320 such that the quantum computing process (including any compilation, verification, and QP control procedures) can be remotely controlled by the remote computer 1360. In general, the remote computer 1360 communicates with the QP controller (s) 1320, compiler/synthesizer 1322, and/or verification tool 1323 via communication connections 1350.

In particular embodiments, the environment 1300 can be a cloud computing environment, which provides the quantum processing resources of the environment 1300 to one or more remote computers (such as remote computer 1360) over a suitable network (which can include the internet).

9. Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

What is claimed is:

1. A system, comprising:

a quantum computer; and one or more classical-computing devices, at least some of the one or more classical computing devices being programmed to transform a quantum computation of the form $$C_2 M(a, Z_{i(2)}) C_1 \exp\left(i\phi Z_{i(1)}\right) C_0 |0\rangle^{\otimes n}$$

to a sequence of exponentials and measurements of the form:

$$M(a, P_2)\exp(i\phi P_1)|0\rangle^{\otimes n}$$

in which $P_1$ and $P_2$ are multiple qubit Pauli operators, $M(a,P_2)=(I+aP_2)/2$ denotes measurement of the multiple qubit Pauli operator $P_2$ with outcome $a=\pm1$, wherein/is the identity matrix, wherein $$P_1 = C_0^T Z_{i(1)}) C_0, \text{ and } P_2 = (C_1 C_0)^\dagger M(a, Z_{i(2)}) C_1 C_0,$$

construct a tree (V,E) with root node r∈V, the tree describing a 2D grid of qubits in which each vertex V describes a qubit in the 2D grid, and vertices describing nearest neighbor qubits in the 2D grid are connected by an edge in E; and configure the quantum computer comprising the 2D grid of qubits to implement the sequence of exponentials and measurements using:

one-qubit measurements and one-qubit Clifford unitaries, either (A) controlled Z-gates or (B) two-qubit measurements on nearest neighbor qubits described by vertices connected by an edge in E, (A) or (B) being used to perform multi-target controlled Z-gates and each Clifford C and $C^\dagger$ such that $CZ_rC^\dagger=P$ being constructed using multi-target controlled Z-gates, and single qubit rotations that are only performed on the qubits described by the root node r.

2. One or more classical-computer-readable-media storing classical-computer-executable instructions, which when executed by a classical computer cause the classical computer to transform a quantum computation of the form $$C_2M(a, Z_{i(2)})C_1\exp(i\phi Z_{i(1)})C_0|0\rangle^{\otimes n}$$

to a sequence of exponentials and measurements of the form:

$$M(a, P_2)\exp(i\phi P_1)|0\rangle^{\otimes n}$$

in which $P_1$ and $P_2$ are multiple qubit Pauli operators, $M(a,P_2)=(I+aP_2)/2$ denotes measurement of the multiple qubit Pauli operator $P_2$ with outcome $a=\pm1$, wherein I is the identity matrix, wherein $$P_1 = C_0^TZ_{i(1)})C_0, \text{ and } P_2 = (C_1C_0)^\dagger M(a, Z_{i(2)})C_1C_0,$$

construct a tree (V,E) with root node r∈V, the tree describing a 2D grid of qubits in which each vertex V describes a qubit in the 2D grid, and vertices describing nearest neighbor qubits in the 2D grid are connected by an edge in E; and configure the quantum computer comprising the 2D grid of qubits to implement the sequence of exponentials and measurements using:

one-qubit measurements and one-qubit Clifford unitaries, either (A) controlled Z-gates or (B) two-qubit measurements on nearest neighbor qubits described by vertices connected by an edge in E, (A) or (B) being used to perform multi-target controlled Z-gates and each Clifford C and $C^\dagger$ such that $CZ_rC^\dagger=P$ being constructed using multi-target controlled Z-gates, and single qubit rotations that are only performed on the qubits described by the root node r.

3. A method performed by one or more classical computing devices, comprising:

transforming a quantum computation of the form $$C_2M(a, Z_{i(2)})C_1\exp(i\phi Z_{i(1)})C_0|0\rangle^{\otimes n}$$

to a sequence of exponentials and measurements of the form:

$$M(a, P_2)\exp(i\phi P_1)|0\rangle^{\otimes n}$$

in which $P_1$ and $P_2$ are multiple qubit Pauli operators, $M(a,P_2)=(I+aP_2)/2$ denotes measurement of the multiple qubit Pauli operator $P_2$ with outcome $a=\pm1$, wherein I is the identity matrix, wherein $$P_1 = C_0^TZ_{i(1)})C_0, \text{ and } P_2 = (C_1C_0)^\dagger M(a, Z_{i(2)})C_1C_0,$$

constructing a tree (V,E) with root node r∈V, the tree describing a 2D grid of qubits in which each vertex V describes a qubit in the 2D grid, and vertices describing nearest neighbor qubits in the 2D grid are connected by an edge in E; and configuring a quantum computer comprising the 2D grid of qubits to implement the sequence of exponentials and measurements using:

one-qubit measurements and one-qubit Clifford unitaries, either (A) controlled Z-gates or (B) two-qubit measurements on nearest neighbor qubits described by vertices connected by an edge in E, (A) or (B) being used to perform multi-target controlled Z-gates and each Clifford C and $C^\dagger$ such that $CZ_rC^\dagger=P$ being constructed using multi-target controlled Z-gates, and single qubit rotations that are only performed on the qubits described by the root node r.

4. The method of claim 3, wherein qubits of the quantum computer comprise data qubits, interface qubits, and ancilla qubits.

5. The method of claim 4, where a graph of qubit connectivity satisfies a condition of providing an ancilla-path from one or more data qubits to the interface qubits.

6. The method of claim 4, wherein every data qubit is connected to an interface qubit via a path of ancilla qubits.

7. A system, comprising:

a quantum computer; and one or more classical-computing devices, at least some of the one or more classical computing devices being programmed to:

transform a quantum computation of the form $$C_2M(a, Z_{i(2)})C_1\exp(i\phi Z_{i(1)})C_0|0\rangle^{\otimes n}$$

to a sequence of exponentials and measurements of the form:

$$M(a, P_2)\exp(i\phi P_1)|0\rangle^{\otimes n}$$

in which $P_1$ and $P_2$ are multiple qubit Pauli operators, $M(a,P_2)=(1+aP_2)/2$ denotes measurement of the multiple qubit Pauli operator $P_2$ with outcome $a=\pm1$, wherein I is the identity matrix, wherein $$P_1 = C_0^TZ_{i(1)})C_0, \text{ and } P_2 = (C_1C_0)^\dagger M(a, Z_{i(2)})C_1C_0,$$

construct a tree (V,E) with root node r∈V, the tree describing a 2D grid of qubits in which each vertex V describes a qubit in the 2D grid, and vertices describing nearest neighbor qubits in the 2D grid are connected by an edge in E; and configure the quantum computer comprising the 2D grid of qubits to implement the sequence of exponentials and measurements using:

one-qubit measurements and one-qubit Clifford unitaries, either (A) controlled Z-gates or (B) two-qubit measurements on nearest neighbor qubits described by vertices connected by an edge in E, (A) or (B) being used to perform multi-target controlled Z-gates and each Clifford C and $C^\dagger$ such that $CZ_rC^\dagger=P$ being constructed using multi-target controlled Z-gates, and single qubit rotations that are only performed on the qubits described by the root node r, wherein qubits of the quantum computer comprise data qubits, interface qubits, and ancilla qubits and a graph of qubit connectivity satisfies a condition of providing an ancilla-path from one or more data qubits to the interface qubits.

* * * * *